(12) United States Patent
Jahnes et al.

(10) Patent No.: US 9,593,007 B2
(45) Date of Patent: Mar. 14, 2017

(54) METHOD OF FORMING A MICRO-ELECTRO-MECHANICAL SYSTEM (MEMS) STRUCTURE

(71) Applicant: INTERNATIONAL BUSINESS MACHINES CORPORATION, Armonk, NY (US)

(72) Inventors: Christopher V. Jahnes, Upper Saddle River, NJ (US); Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 170 days.

(21) Appl. No.: 14/519,772

(22) Filed: Oct. 21, 2014

(65) Prior Publication Data
US 2015/0054100 A1 Feb. 26, 2015

Related U.S. Application Data

(62) Division of application No. 13/164,323, filed on Jun. 20, 2011, now Pat. No. 8,973,250.

(51) Int. Cl.
*H04R 31/00* (2006.01)
*B81B 3/00* (2006.01)
(Continued)

(52) U.S. Cl.
CPC ............ *B81B 3/001* (2013.01); *B81B 3/0059* (2013.01); *B81B 3/0072* (2013.01); *B81C 1/0015* (2013.01); *B81C 1/00015* (2013.01); *G06F 17/5045* (2013.01); *B81B 3/0021* (2013.01); *B81B 7/0006* (2013.01); *B81B 7/008* (2013.01);
(Continued)

(58) Field of Classification Search
CPC ..... B81C 1/00047; B81C 1/00; B81C 1/0015; B81B 3/00; B81B 3/001; B81B 3/0078; H01L 41/113; H01L 41/1138
USPC ... 29/592.1, 594, 606, 609.1, 622, 825, 830, 29/843, 846, 874; 361/277, 278, 280, 281
See application file for complete search history.

(56) References Cited

U.S. PATENT DOCUMENTS 5,786,621 A    7/1998  Saif et al.
5,880,921 A *  3/1999  Tham ................. H01H 59/0009
                                                      333/262
(Continued)

OTHER PUBLICATIONS

Patents Act 1977: Examination Report under Section 18(3), dated Mar. 20, 2015, Application No. GB1322198.1, 2 pages.
(Continued)

*Primary Examiner* — Paul D Kim
(74) *Attorney, Agent, or Firm* — Nathan M. Rau

(57) ABSTRACT

Micro-Electro-Mechanical System (MEMS) structures, methods of manufacture and design structures are provided. A wiring layer is formed on a substrate comprising actuator electrodes and a contact electrode. A MEMS beam is formed above the wiring layer and at least one spring is formed and attached to at least one end of the MEMS beam. At least one spring has a predetermined spring constant based on a coefficient of thermal expansion (CTE) mismatch between materials of the MEMS structure and the spring. Additionally, an array of mini-bumps is formed between the wiring layer and the MEMS beam. A size of a space between fixed actuator electrodes or dummy actuators is determined based on a lateral shift of the MEMS beam.

5 Claims, 15 Drawing Sheets

(51) Int. Cl.
  *B81C 1/00* (2006.01)
  *G06F 17/50* (2006.01)
  *B81B 7/00* (2006.01)
  *H01L 41/113* (2006.01)
  *H01L 41/09* (2006.01)

(52) U.S. Cl.
  CPC . *B81B 2201/016* (2013.01); *B81B 2203/0163* (2013.01); *B81C 1/00476* (2013.01); *H01L 41/094* (2013.01); *H01L 41/1134* (2013.01); *H01L 41/1138* (2013.01); *Y10T 29/49002* (2015.01); *Y10T 29/49005* (2015.01); *Y10T 29/4908* (2015.01); *Y10T 29/49121* (2015.01)

(56) References Cited

U.S. PATENT DOCUMENTS

| | | | |
|---|---|---|---|
| 6,720,267 B1 | 4/2004 | Chen et al. | |
| 6,786,621 B2 | 9/2004 | Sviland | |
| 6,876,282 B2 | 4/2005 | Andricacos et al. | |
| 6,876,482 B2 | 4/2005 | DeReus | |
| 7,050,320 B1 * | 5/2006 | Lai | B82Y 10/00 257/414 |
| 7,283,024 B2 | 10/2007 | Bar et al. | |
| 7,319,580 B2 | 1/2008 | Chou | |
| 7,345,808 B2 * | 3/2008 | Nakanishi | A61B 3/14 359/291 |
| 7,381,663 B2 * | 6/2008 | Sato | G06K 9/0002 257/415 |
| 7,548,144 B2 * | 6/2009 | Kim | H01H 59/0009 200/181 |
| 7,554,711 B2 | 6/2009 | Miles | |
| 7,711,239 B2 | 5/2010 | Sasagawa et al. | |
| 7,736,931 B1 | 6/2010 | Guo | |
| 7,758,912 B2 | 7/2010 | Reboa | |
| 8,304,274 B2 * | 11/2012 | Zuniga-Ortiz | B81C 1/0023 257/415 |
| 2003/0214373 A1 | 11/2003 | Andricacos et al. | |
| 2003/0227361 A1 | 12/2003 | Dickens et al. | |
| 2005/0156695 A1 | 7/2005 | Andricacos et al. | |
| 2006/0262380 A1 | 11/2006 | Miles | |
| 2006/0278942 A1 | 12/2006 | Rubel | |
| 2008/0230909 A1 | 9/2008 | Chilcott | |
| 2010/0181652 A1 | 7/2010 | Milne et al. | |
| 2012/0319528 A1 * | 12/2012 | Jahnes | B81B 3/001 310/300 |

OTHER PUBLICATIONS

Patents Act 1977: Patents Rules 2007, Notification of Grant: Patent Serial No. GB2505825, dated May 12, 2015, Application No. GB1322198.1, 2 pages.
Patent Cooperation Treaty: International Preliminary Report on Patentability, International Application No. PCT/US2012/040339, 6 pages.
Response to Examination Search Report for Application No. GB1322198.1, dated Mar. 20, 2015, 47pp.
International Search Report for Application No. PCT/US12/40339, date of mailing—Aug. 21, 2012.
Written Opinion of the International Searching Authority for Application No. PCT/US12/40339, date of mailing—Aug. 21, 2012.

* cited by examiner

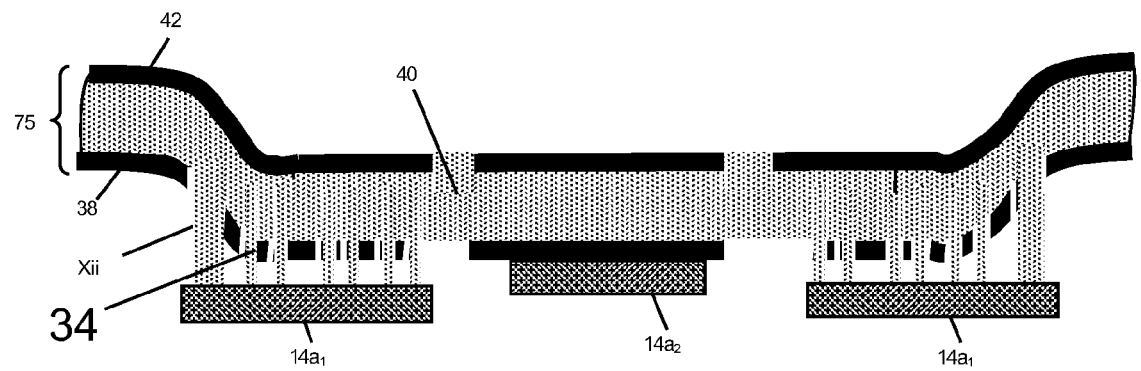
FIG. 11
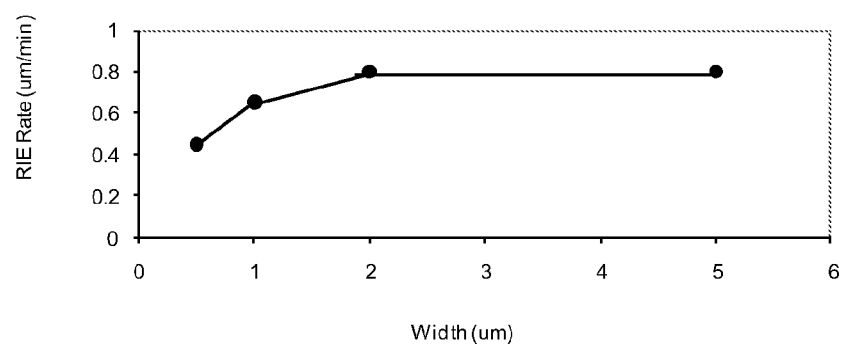
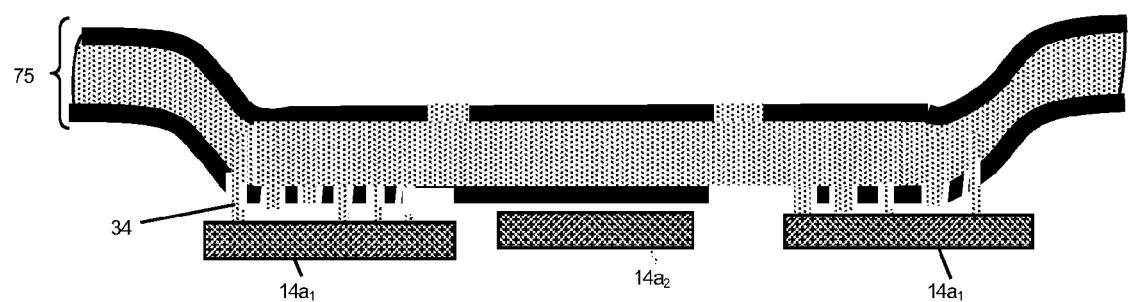
FIG. 12

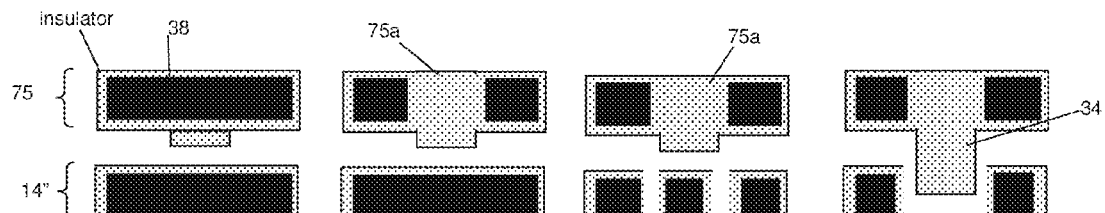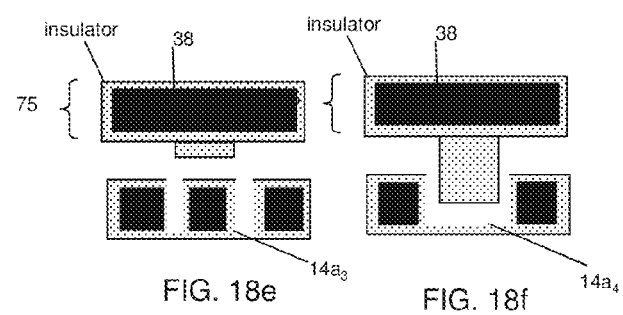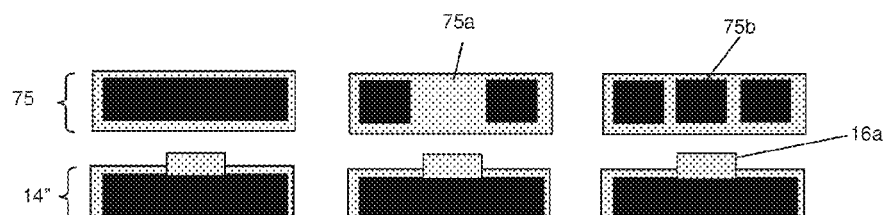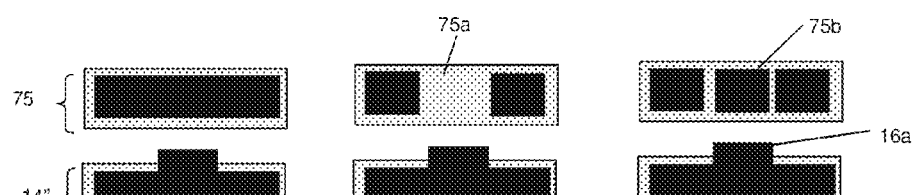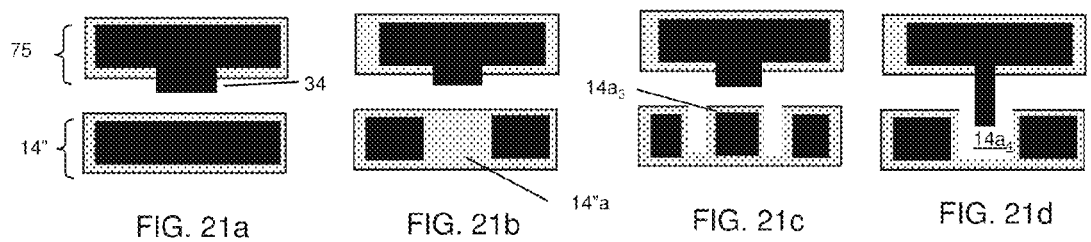

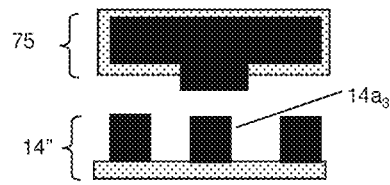
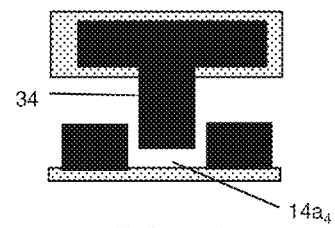
FIG. 22a  FIG. 22b
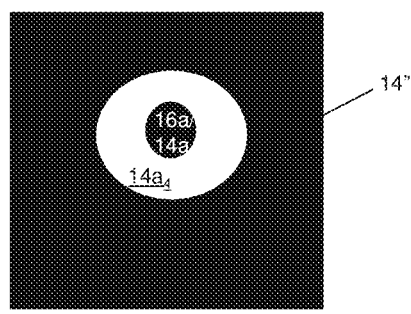
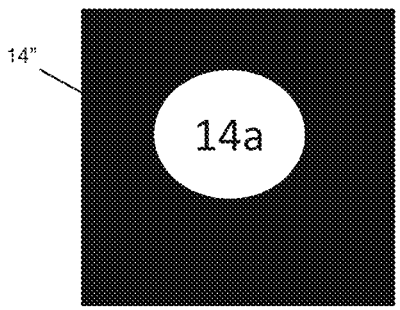
FIG. 23a  FIG. 23b
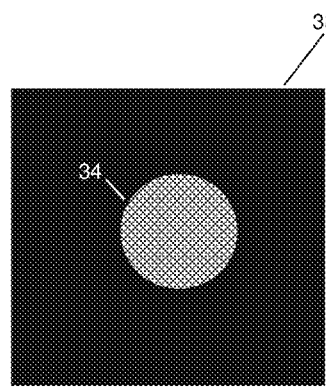
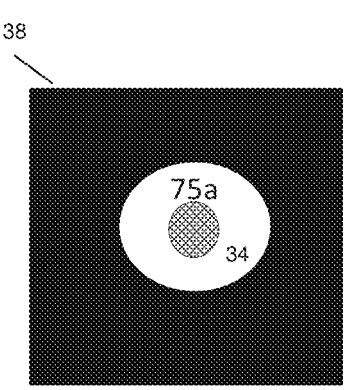
FIG. 23c  FIG. 23d

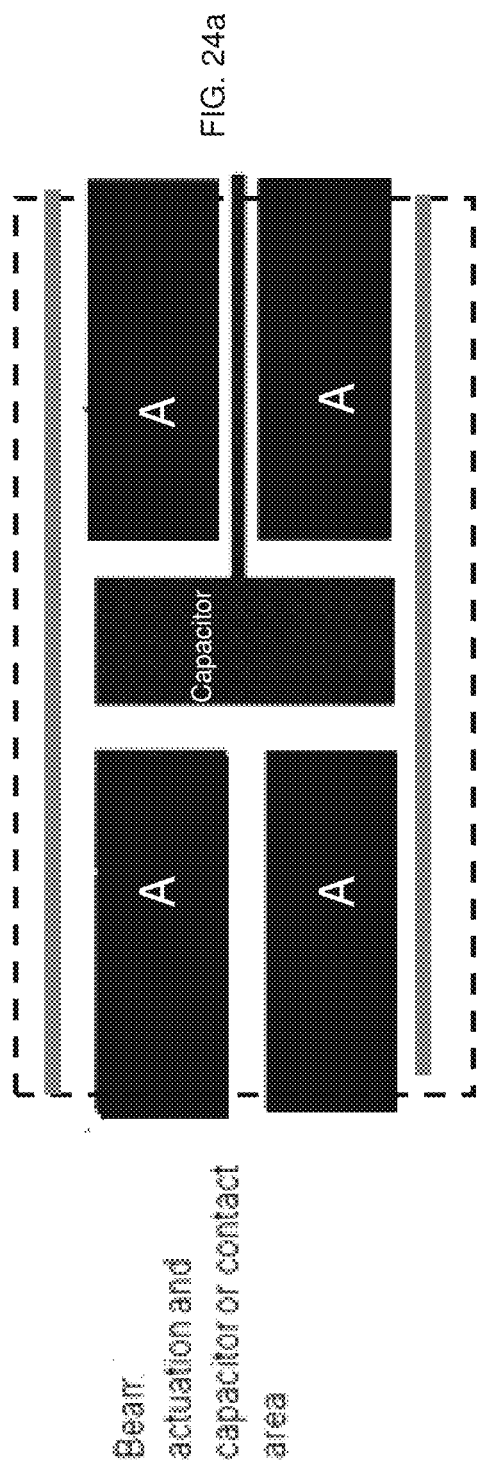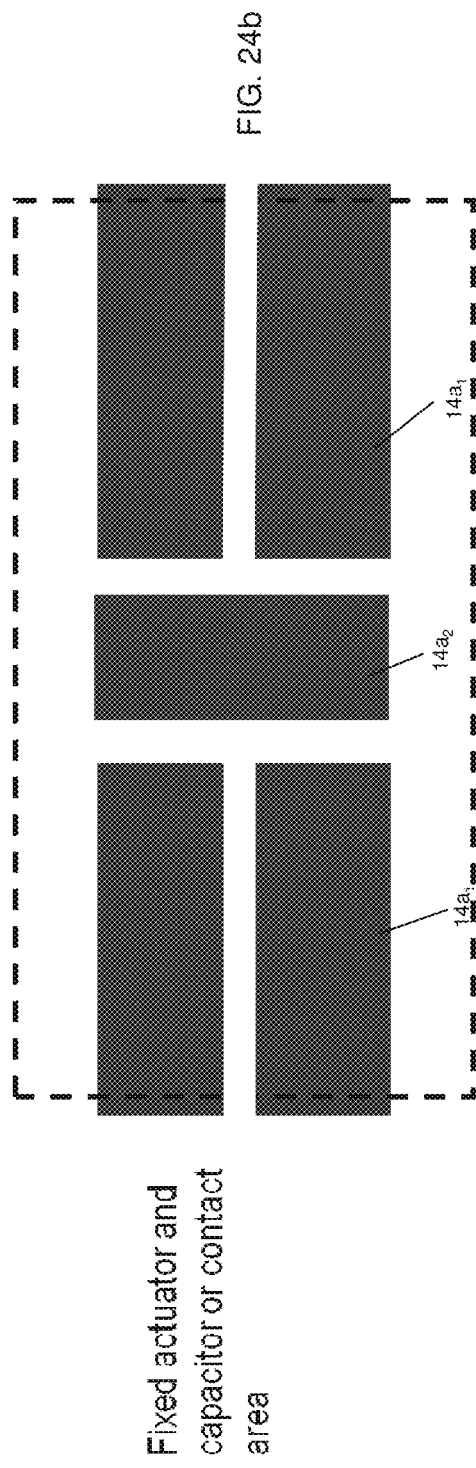

Beam, actuation and capacitor or contact area

Fixed actuator and capacitor or contact area

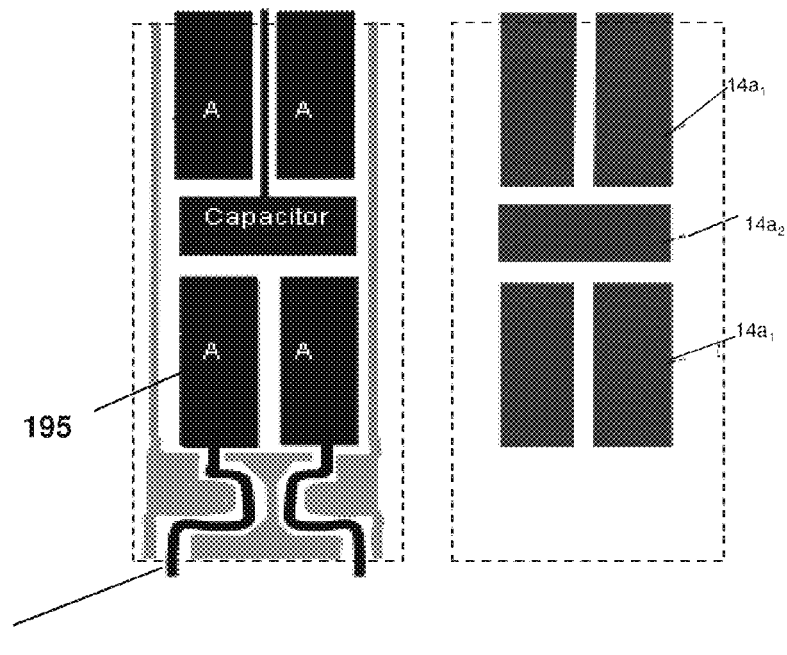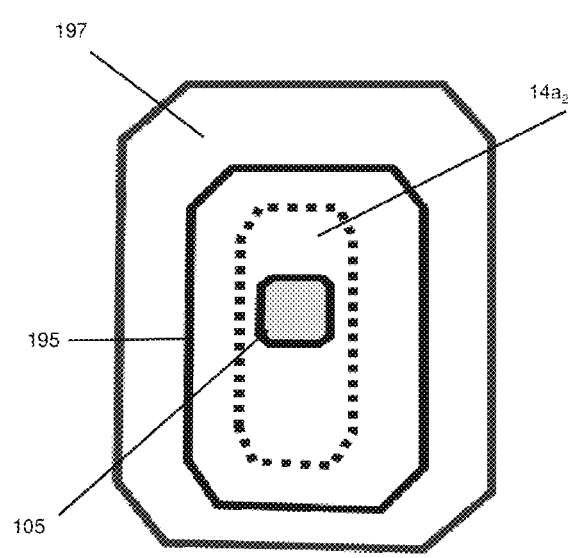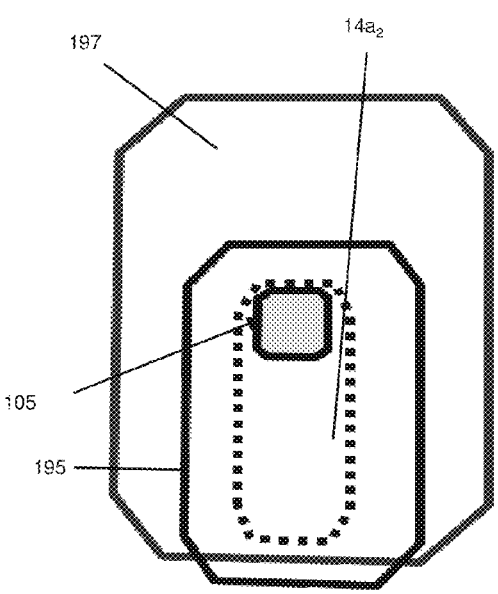
FIG. 27a
FIG. 27b

METHOD OF FORMING A MICRO-ELECTRO-MECHANICAL SYSTEM (MEMS) STRUCTURE

This is a division of application Ser. No. 13/164,323 filed Jun. 20, 2011, now U.S. Pat. No. 8,973,250.

FIELD OF THE INVENTION

The invention relates to semiconductor structures and methods of manufacture and, more particularly, to Micro-Electro-Mechanical System (MEMS) structures, methods of manufacture and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e., resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Accordingly, there exists a need in the art to overcome the deficiencies and limitations described hereinabove.

SUMMARY

In a first aspect of the invention, a method of forming a Micro-Electro-Mechanical System (MEMS) structure comprises forming a wiring layer on a substrate comprising actuator electrodes and a contact electrode. The method further comprises forming a MEMS beam above the wiring layer. The method further comprises forming at least one spring attached to at least one end of the MEMS beam. The method further comprises forming an array of mini-bumps between the wiring layer and the MEMS beam.

In another aspect of the invention, a method of forming a MEMS structure comprises forming a MEMS beam and forming a plurality of electrodes. The method further comprises forming an array of mini-bumps between the MEMS beam and the plurality of electrodes. The method further comprises determining a size of a space between fixed actuator electrodes of the plurality of electrodes or a dummy actuator based on a lateral shift of the MEMS beam.

In another aspect of the invention, a MEMS structure comprises a first set of wires on a substrate comprising fixed actuator electrodes and a contact. The structure further comprises a second set of wires above the first set of wires; at least one spring attached to at least one end of at least one of the second set of wires to accommodate a lateral shift of the second set of wires. The structure further comprises an array of mini-bumps between the first set of wires and the second set of wires. The array of mini-bumps are structured to prevent portions of the second set of wires from contacting the fixed actuator electrodes, upon actuation.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MEMS, which comprises the structures of the present invention. In still further embodiments, a method in a computer-aided design system is provided for generating a functional design model of the MEMS. The method comprises generating a functional representation of the structural elements of the MEMS.

More specifically, in embodiments, a hardware description language (HDL) design structure encoded on a machine-readable data storage medium is provided. The HDL design structure comprises elements that when processed in a computer-aided design system generates a machine-executable representation of a MEMS structure. The HDL design structure comprises: a first set of wires on a substrate, comprising fixed actuator electrodes and a contact; a second set of wires above the first set of wires; at least one spring attached to at least one end of at least one of the second set of wires to accommodate a lateral shift of the second set of wires; and an array of mini-bumps between the first set of wires and the second set of wires, wherein the array of mini-bumps are structured to prevent portions of the second set of wires from contacting the fixed actuator electrodes, upon actuation.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

FIG. 11 shows a side cross sectional view of a MEMS structure in accordance with an aspect of the present invention;

FIG. 12 shows a side cross sectional view of a MEMS structure in accordance with an additional aspect of the present invention;

FIGS. 18a-18f show various configurations of an array of actuator bumps in accordance with the present invention;

FIGS. 19a-19c show various configurations of an array of actuator bumps in accordance with the present invention;

FIGS. 20a-20c show various configurations of an array of actuator bumps in accordance with the present invention;

FIGS. 21a-21d show various configurations of an array of actuator bumps in accordance with the present invention;

FIGS. 22a-22b show various configurations of an array of actuator bumps in accordance with the present invention;

FIGS. 23a-23d show different layouts for an actuator electrode and MEMS beam in accordance with additional aspects of the present invention;

FIGS. 24a and 24b show top views of different cross sections of a MEMS bridge structure fabricated in accordance with aspects of the present invention;

FIGS. 26a and 26b show top views of different cross sections of a MEMS bridge structure with a spring fabricated in accordance with aspects of the present invention;

FIG. 27a shows a MEMS beam and mini-bumper with no lateral shift in accordance with aspects of the present invention;

FIG. 27b shows a MEMS beam and mini-bumper with lateral shift in accordance with aspects of the present invention.

DETAILED DESCRIPTION

Figure 1A:
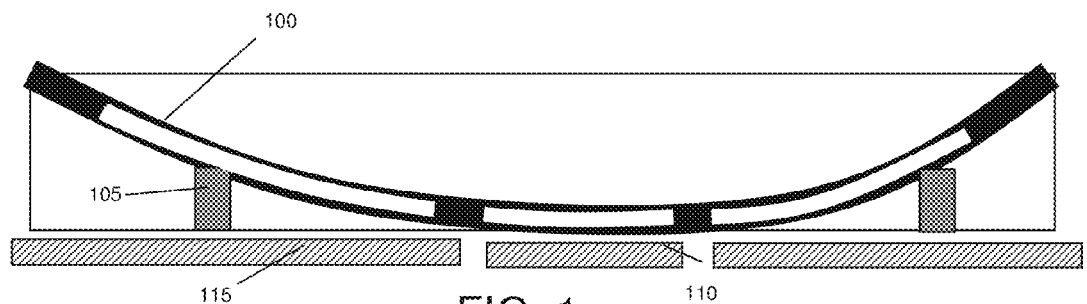
FIG. 1a shows a MEMS beam under collapse.

The invention relates to semiconductor structures and methods of manufacture and, more particularly, to Micro-Electro-Mechanical System (MEMS) structures, methods of manufacture and design structures. In embodiments, the MEMS structures can be, for example, any MEMS devices such as, for example, MEMS capacitors, an ohmic switch, MEMS accelerometers, or any MEMS device which uses an actuator. In addition, the MEMS structures can be used, for example, as a single or dual wire beam contact switch, dual wire beam capacitor switch, or single dual wire beam air gap inductor, amongst other devices. The MEMS structure of the present invention can also be a cantilever beam structure or a bridge beam, for example.

MEMS can be manufactured in a number of ways using a number of different tools. In general, though, the methodologies and tools are used to form small structures with dimensions in the micrometer scale with switch dimensions of approximately 5 μm thick, 100 μm wide, and 400 μm long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

For example, in MEMS cantilever type switches the fixed electrodes and suspended electrode are typically manufactured using a series of conventional photolithographic, etching and deposition processes. In one example, after the suspended electrode is formed, a layer of sacrificial material, e.g., the spin-on polymer PMGI made by Microchem, Inc., is deposited under the MEMS structure, to form a cavity, and over the MEMS structure to form a cavity. The cavity over the MEMS is used to support the formation of a cap, e.g., $SiO_2$ and SiN dome, to seal the MEMS structure after the sacrificial material is removed. In certain implementations, silicon is used to form the sacrificial cavity around the MEMS; although other materials are also contemplated by the present invention.

The MEMS beam could be a single wire without oxide, a damascene wire in oxide, metal/oxide/metal, oxide/silicon/oxide, etc. However, current MEMS beam design suffer from stiction due to, for example, dielectric charging when actuators make intimate contact during repeated cycling. To compensate for stiction, an oxide bumper could be used under the beam or near the fixed actuator wire. However, current manufacturing processes result in an oxide bumper that is either too shallow or too far from capacitor, which results in a large beam collapse area and actuator contact, resulting in cycling fails due to stiction. Also, due to manufacturing variations, if oxide bumps are too deep or too close to the capacitor, then the delta capacitance, which is defined as the difference between the actuated and un-actuated MEMS capacitance, will be reduced due to the oxide bumps blocking contact of the capacitor area of the MEMS, which results in performance degradation. The phenomena of stiction may also occur on the capacitor if the electric field is of a high enough value to also cause dielectric charging.

Figure 1B:
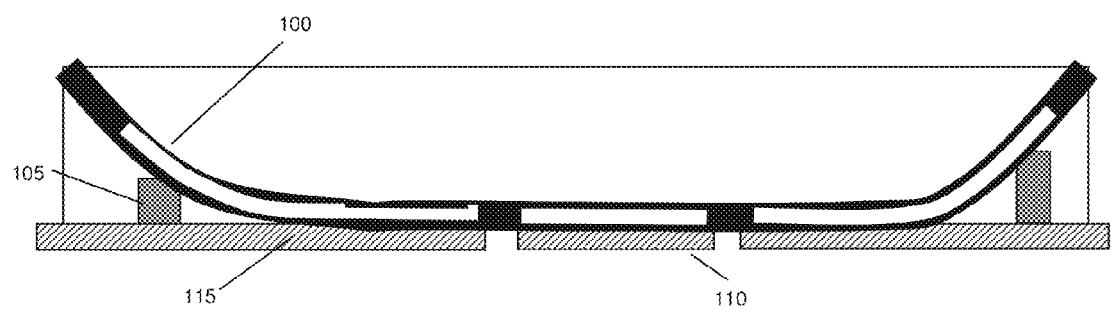
FIG. 1b shows a MEMS beam over collapse.

FIG. 1a shows a MEMS beam 100 under collapse due to incorrect layout or placement of large bumps 105 under the MEMS beam and FIG. 1b shows a MEMS beam 100 over collapse, due to incorrect placement of large bumps 105 under the MEMS beam 100. For the under collapse case of FIG. 1a, the large bumps 105 are either too tall or are placed too close to the capacitor head 110, resulting in the desired blockage of contact of the actuator 115 but the undesired result that the capacitor head 110 is not in intimate contact, resulting in decreased actuated capacitance. For the over collapse case of FIG. 1b, the large bumps 105 are either too shallow, are placed too far from the capacitor head 115, or are omitted resulting in a large actuator contact area, which can result in MEMS beam stiction (i.e., failure).

Figure 1C:
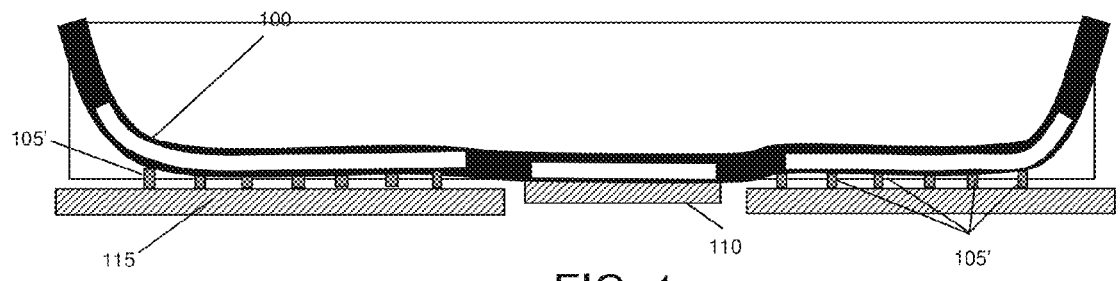
FIG. 1c shows a MEMS beam in accordance with aspects of the present invention.

FIG. 1c shows an embodiment of the present invention, in which an array of shallow mini-bumps 105' (also noted in additional figures at reference numeral 34a, 34b, 34c, etc. in the present specification) is placed under the beam 100 between the actuators 115. This structure of the present invention results in total collapse of the beam 100 and high capacitance head capacitance but avoidance of actuator stiction. As mentioned herein, the present invention is applicable to any MEMS device where actuator contact is undesirable, such as ohmic contact switches; and can be used with or without large bumps 105.

More specifically, in embodiments, the MEMS structures comprise a plurality of actuator bumps 105', e.g., an array of mini-bumps or anti-stiction bumps, formed on a surface of at least one of the MEMS beam 100 and/or actuator electrode 115. The plurality of actuator bumps 105' should be located and have depth both to avoid decreasing capacitance and to reduce or eliminate actuator contact. In embodiments, the mini-bumps 105' are about 10-250 nm deep and, in one exemplary embodiment, are about 50 nm deep. Advantageously, the array of mini-bumps 105' over the actuator 115 reduce the opportunity for stiction to occur in the MEMS device after repeated cycling or holding down of the MEMS beam 100.

In addition, unlike conventional bumps which are located far away from the capacitor portion of the beam and designed to block the actuator in the beam from contacting the fixed actuator under the beam when the beam collapses and the capacitor portion of the beam makes contact, mini-bumps 105' are placed in an array under the beam actuator 115 such that the beam collapses over the fixed actuator 115. Placing mini-bumps 105' in an array under the actuator in the beam eliminates the conventional bump problem of being either too shallow or located far from the capacitor portion of the beam; or too deep or located too close to the capacitor portion of the beam. Accordingly, the structures of the present invention is an array of actuator bumps 105' located throughout the beam structure, but which either does not reduce actuated capacitance or does not significantly reduce actuated capacitance. The latter advantage arises because the structures of the present invention either do not block or substantially do not block contact with the capacitor, e.g., fixed contact electrode. Although this discussion focuses on MEMS capacitors, it also applies to any other MEMS device with separate actuator and contact areas, such as an ohmic contact switch with insulated actuators and metal contact areas.

In embodiments, the array of actuator bumps 105' can be $SiO_2$ (oxide) or other material extending down from underneath the MEMS beam actuator or, alternatively, extending up from a fixed actuator wiring layer (e.g., actuator electrode). In still additional embodiments, the array of actuator bumps 105' can be provided on both the MEMS beam and the actuator wiring layer. As described below, additional variations are also contemplated by the present invention such as, for example, actuator bumps composed of metal or other materials, or positioned at certain locations with respect to the MEMS beam and the lower actuator wiring layer and/or composed of varying shapes and sizes. Prior to discussing the figures, it should be recognized that, in embodiments, all layers in the figures that are formed on top of another layer are in direct contact with such layer.

Figure 2A:
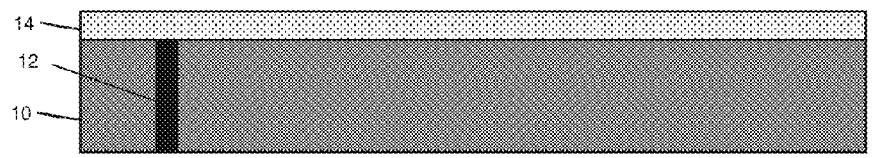
FIGS. 2a-10 show processing steps and respective MEMS structures in accordance with aspects of the invention.

FIG. 2a shows a starting structure and related processing steps in accordance with aspects of the invention. The structure includes, for example, a substrate 10 which, in embodiments, can be any layer of a device such as wires, transistors, passive elements, memory elements, etc. For example, in embodiments, the substrate 10 is a silicon wafer coated with silicon dioxide or other insulator material known to those of skill in the art. An interconnect 12 is provided within the substrate 10. The interconnect 12 can be, for example, a tungsten or copper stud provided in a conventionally formed via or, alternatively, could be wire. For example, the interconnect 12 can be formed using any conventional lithographic, etching and deposition process, known to those of skill in the art for forming studs, e.g., damascene processes. The interconnect 12 could contact other wiring levels, CMOS transistors or other active devices, passive devices, etc.

Still referring to FIG. 2a, a wiring layer 14 is formed on the substrate 10, which, in later processing steps, forms multiple wires. In one non-limiting example, the wiring layer 14 can be deposited on the substrate to a depth of about 0.05 to 4 μm and preferably to a depth of 0.25 μm; although other dimensions are also contemplated by the present invention. In embodiments, the wiring layer 14 can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, the wiring layer 14 could be formed from pure refractory metals, or aluminum or an aluminum alloy such as AlCu, AlSi, or AlCuSi. In embodiments, the wiring layer 14 can be doped with Si, e.g., 1%, to prevent the metal, e.g., Al, from reacting with an upper cavity layer material, e.g., silicon. In embodiments the aluminum portion of the wire layer 14 can be doped with Cu, e.g. 0.5%, to increase the electromigration resistance of the wire. In embodiments, the wire could be cladded with Ti and capped with an antireflective layer TiN, e.g. Ti/Al/Ti/TiN. In embodiments, the wire could be a damascene wire lined with a refractory metal such as TiN or Ta, filled with tungsten, copper, and the like as known in the art.

Figure 2B:
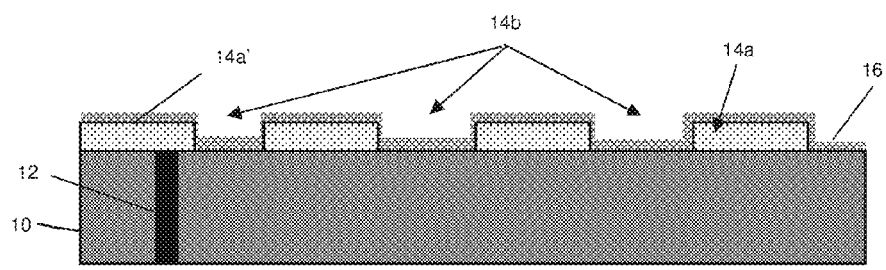

As shown in FIG. 2b, the wiring layer 14 is patterned to form a plurality of wires (lower electrodes) 14a having a wire spacing (gap) 14b therebetween. In embodiments, the wiring layer can be patterned using conventional lithographic and etching processes. For example, a resist can be formed on the wiring layer and exposed to light to form openings, e.g., patterns, exposing portions of the underlying wiring layer. The exposed wiring layer can then undergo a reactive ion etch (RIE) process, for example, to form the wires 14a. In embodiments, at least one of the wires 14a' is in contact (direct electrical contact) with the interconnect 12. In embodiments, the wires could be annealed after deposition or after patterning.

In embodiments, the wire space aspect ratio can be, for example, a low aspect or a high aspect ratio. For example, a low aspect ratio of 1:20 is contemplated by the present invention by forming a 50 nm tall wire 14a with a 1000 nm space 14b; whereas, a high aspect ratio of 1:1 could be formed from a 500 nm tall wire 14a with a 500 nm space 14b. These aspect ratio values are provided herein for reference only and should not be considered a limiting feature of the present invention. Alternatively, the wires 14a could be formed using a damascene process, such as damascene Cu or W, as known in the art.

Still referring to FIG. 2b, an insulator layer (dielectric layer) 16 is formed on the multiple wires 14a and exposed portions of the substrate 10. A robust insulator layer 16 is preferred in order to prevent the formation of an intermetallic during the subsequent cavity formation, which is difficult to remove and, if formed, can block MEMS beam activation by blocking the beam from fully collapsing during actuation intermetallic. In embodiments, the insulator layer 16 is an oxide material, such as $SiO_2$ or $Al_2O_3$, deposited at temperatures compatible with aluminum wiring, e.g., under about 420° C. and preferably under about 400° C. Deposition options for insulator layer 16 include, for example, one or more of plasma-enhanced CVD (PECVD), sub-atmospheric CVD (SACVD), atmospheric pressure CVD (APCVD), high density plasma CVD (HDPCVD), physical vapor deposition (PVD), or atomic layer deposition (ALD).

In embodiments, the insulator layer 16 is an oxide deposited to a depth of about 80 nm; although other dimensions are also contemplated by the present invention. This insulator layer 16, which is only required if a MEMS capacitor is being fabricated, will form the lower capacitor plate dielectric. The insulator layer 16 also acts as a barrier between the metal in wire 14a, e.g., aluminum, and the subsequent material, e.g., silicon, used to form a MEMs cavity.

Figure 3:
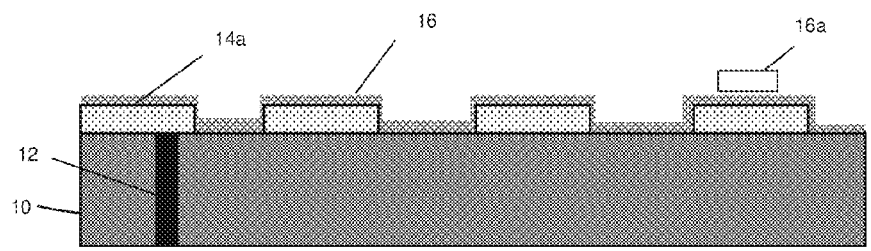

In FIG. 3, an optional array of actuator bumps 16a are formed on one or more of the wires 14a. In embodiments, the optional array of bumps 16a are composed of dielectric material such as, for example, silicon dioxide; although other materials are also contemplated by the present invention. For example, the array of actuator bumps 16a can be composed of a metal such as, for example, the same material as the wires 14a. In embodiments, the array of bumps 16a, for example, can be aligned with a space in a subsequently form MEMS beam, an isolated portion of the MEMS beam or other configurations as described below. Also, in embodiments, the optional array of actuator bumps 16a are formed on the actuator electrodes, at a predefined spacing and height to prevent the MEMS beam from contacting the actuator electrodes. This will prevent and/or reduce stiction and beam collapse during repeated beam cycling. However, the predefined spacing and height, e.g., size and shape, of the array of actuator bumps will still allow contact between the MEMS beam and the fixed electrode (e.g., capacitor electrode). As one illustrative non-limiting example, the array of bumps 16a can be about 10 nm to 80 nm tall and about 0.1 to 1 μm wide. In embodiments, the optional array of actuator bumps 16a could be formed by patterning and etching the oxide under the wires 14a or could be a deposited and patterned material under the wires 14a.

The array of bumps 16a can be formed prior to the formation of the deposition of the insulator layer 16. For example, the optional array of bumps 16a can be a deposited PECVD SiO$_2$ film, which is patterned and etched directly on the wires 14a using conventional lithographic and etching processes. With this option, the array of bumps 16a could be patterned and etched first, followed by patterning and etching of the wires 14a. In alternative embodiments, the wire 14 could be patterned and etched first followed by the formation of the optional array of bumps 16a. Patterning and etching the array of bumps 16a prior to the patterning and etching of the wire 14a avoids increasing the aspect ratio incoming to the deposition of the insulator layer 16 due to overetch into the oxide under the wire 14 between wire spaces 14a. This is because the oxide between wires 14a is not etched during etching of the array of bumps 16a.

Figure 4:
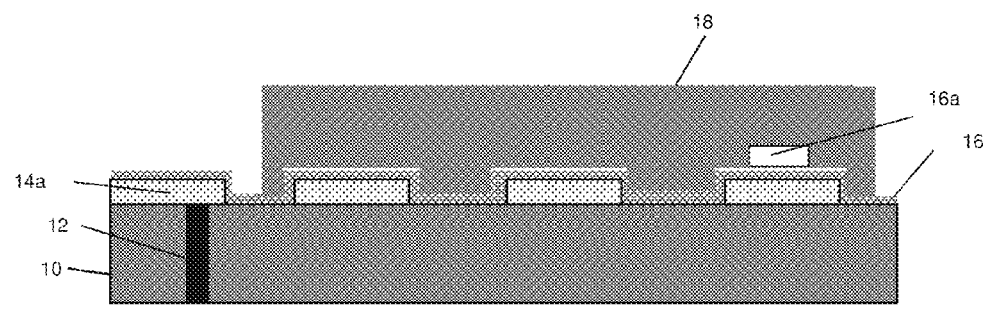

In FIG. 4, a layer of sacrificial cavity material 18 is deposited on the insulator layer 16 or, alternatively, on the wires 14a (if the insulator layer 16 is not present). In embodiments, the layer 18 can be, for example, silicon, tungsten, tantalum, germanium, or any material which can subsequently be selectively removed using, for example XeF$_2$ gas, to the insulator layer 16 or the wires 14a (if the insulator layer 16 is absent). The layer 18 can be deposited using any conventional plasma vapor deposition (PVD), PECVD, rapid thermal CVD (RTCVD), or LPCVD which operates at temperatures compatible with the wires 14a, e.g., <420° C. In embodiments, the layer 18 is deposited to a height of about 0.1 to 10 μm which is determined by the MEMS gap requirement, and is patterned using conventional lithographic and reactive ion etching (RIE) steps. One example would use a silicon thickness of about 2 μm. To avoid leaving oxidized seams on the wafer after etching of the silicon layer 18, the present invention contemplates a combination of argon dilution with rf bias power applied to the wafer to simultaneously sputter and RIE etch the surface. Alternatively, any sacrificial material, such as a spin-on polymer, could be employed to form this and other sacrificial cavities.

In embodiments, the insulator layer 16 also acts to block reaction, alloying, or interdiffusion of the wires 14a and the layer (cavity material) 18. For example, if wires 14a contain aluminum, then the aluminum can react with the silicon to form an aluminum silicide, which is difficult or impossible to remove during the subsequent venting or removal step of layer 18 (sacrificial layer). To prevent such a reaction, a conformal oxidization barrier, such ALD Al$_2$O$_3$ (alumina), ALD Ta$_2$O$_5$ (tantalum pentaoxide), or a combination of both can be deposited as the insulator layer 16. In one exemplary embodiment, layer 16 comprises 80 nm of HDPCVD oxide followed by 15 nm of ALD alumina. In embodiments, using a combination of fast deposition SiO$_2$ and slow deposition alumina is optimal. ALD alumina or similar film can be used under the 80 nm of oxide; and also can be used under the upper MEMS electrode to block silicon reaction with the upper MEMS electrode.

As optional processing steps, the layer 18 can be planarized using, for example, a chemical mechanical polishing (CMP) and then, optionally, additional material (silicon) can be deposited on the polished layer 18 to provide a seamless layer (e.g., silicon layer) on the surface of the lower silicon MEMS cavity. A conventional CMP and subsequent cleaning process, such as brush cleans, dilute hydrofluoric acid (DHF), buffered hydrofluoric acid (BHF), cryogenic cleans, etc. can be performed after any CMP step to remove the native oxide formed on the silicon surface.

More specifically, the layer 18 is deposited on the insulator layer 16 using a conventional deposition process such as, for example, PVD. The layer 18 is planarized using, for example, a CMP process and a second layer of material, e.g., silicon, is deposited on the planarized layer 18. The layers are patterned using conventional lithographic and reactive ion etching (RIE) steps. This silicon deposition, CMP, and second deposition process eliminates divots in the silicon surface, eliminates the chance of oxidizing a seam, and partially or completely planarizes the topography on the silicon surface due to the incoming wires 14a and wire space 14b topography.

One set of example thicknesses would be a 250 nm tall wire 14, a 500 nm space 14a between wires 14a, a 0.9 μm initial silicon deposition thickness, a 400 nm silicon CMP removal over the wires 14a to planarize the 250 nm step over wires 14a, and a subsequent silicon deposition thick enough to re-etch the final thickness target after the subsequent reverse oxide planarization processes. In one exemplary embodiment, 200 nm of silicon is removed from the regions above wires 14a and substantially less than 50 nm in the spaces 14b between wires 14a, which partially planarizes the regions over the wires 14a and spaces 14b.

Silicon CMP is commonly performed to form deep trench DRAM capacitors, as known in the art. With this type of silicon CMP, the CMP process is optimized to maximize the selectivity to the pad insulator (e.g., SiO$_2$ or oxide) films on the wafer surface, i.e., the silicon CMP rate is maximized and the oxide CMP rate is minimized such that the selectivity of silicon to oxide is 50:1. This type of silicon CMP process is optimal for silicon films deposited using CVD but can cause problems for silicon films deposited using PVD. For example, PVD silicon films polished with conventional selective silicon CMP processes may have problems with defects in the PVD silicon film which can cause the local polish rate to be reduced. These PVD silicon defects, which may be due to oxidized silicon, other impurities, or the silicon grain structure, can cause the selective silicon CMP process to leave underpolished point defects on the polished silicon surface. However, to avoid these point defects during silicon CMP, a less selective or non-selective silicon polish process can be used, e.g., using a SiO$_2$ polish chemistry and process instead of a silicon CMP polish chemistry and process.

The use of a less selective silicon polish process eliminates the point surface defects post polish. An example of a selective silicon polish is a basic media, such as TMAH with silica abrasive with a ph high enough to dissolve silicon, i.e., >12, which has a silicon:SiO$_2$ selectivity of 50:1. An example of a non-selective silicon polish is basic media, such as KOH, with a ph<12, which is too low to dissolve the silicon, using a silica abrasive. This non-selective silicon CMP process would have silicon: SiO$_2$ selectivities of less than 50:1 and, in one exemplary embodiment, would be in the range of 2:1 to 1:2.

Figure 6:
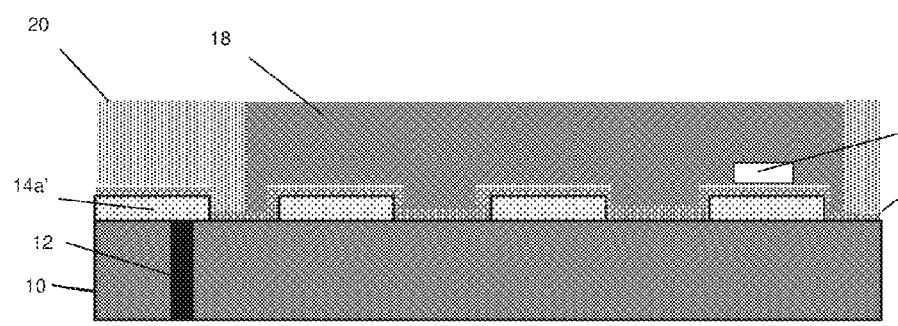

Referring to FIG. 6, an insulator material (e.g., oxide) 20 is deposited on the layer 18 and any exposed portions of the insulator layer 16 and any optional bumps 16a. The deposition can be, for example, a conventional conformal deposition process, depositing the insulator material 20 to a depth of about approximately the same height as the layer 18, e.g., about 2.3 µm for a 2.3 µm thick layer 18. In alternate embodiments, the insulator material 20 can be deposited to a thickness of about 3.3 µm, compared to the 2.3 µm; although other depths are also contemplated by the present invention.

In embodiments, the insulator material 20 is deposited using a 400° C. PECVD oxide deposition using TEOS or silane as a silicon source and oxygen or N$_2$O as an oxygen source. If the thickness of the oxide layer is intentionally thinner than the height of the layer 18, then the subsequent oxide CMP will overpolish and planarize the surface of the layer 18. Conversely, if the thickness of the layer 20 is intentionally thicker than the height of the layer 18, then the subsequent oxide CMP will underpolish the surface of the layer 18 and leave it buried below the oxide (insulator) surface. Both process options can be desirable, depending on how important minimizing the surface of the layer 18 overpolish is vs. planarizing the insulator material 20 or layer 18 surface topography from wiring levels 14a. In one exemplary embodiment, layer 18 is about 2.3 µm, the layer 20 is about 2.1 µm, and the optional oxide etchback step is targeted at a full oxide (insulator) removal, i.e., >2.1 µm. This results in the subsequent oxide polish process further planarizing the layer 18.

Figure 5:
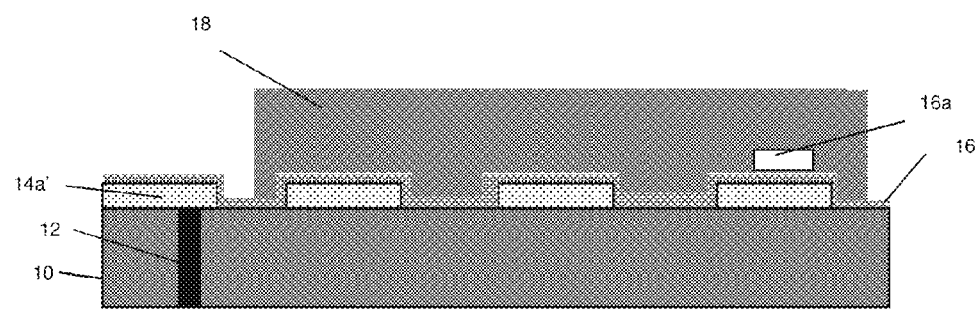

In embodiments, an optional reverse etch (reverse damascene process) can be performed in accordance with aspects of the invention. More specifically, a resist is deposited on the insulator material 20 and is patterned to form an opening, with the resist edges overlapping with edges of the underlying layer 18. That is, the resist will slightly mask the underlying layer 18. In embodiments, the overlap is greater than 0 and can be, for example, 3 µm and is minimized to reduce the oxide layer left to be planarized during the subsequent CMP process. The insulator material 20 is etched using conventional RIE processes, which results in a "picture frame" which surrounds the underlying layer 18, as disclosed in U.S. application Ser. No. 12/974,854, filed on Dec. 21, 2010, the contents of which are incorporated by reference in its entirety herein. The insulator material 20 is then planarized, e.g., to be planar (e.g., a nearly flat or planar surface) with the underlying layer 18. In embodiments, this process will also planarize the underlying layer 18, which will result in a planar cavity structure (e.g., having flat or planar surfaces) in subsequent processing steps. The planarization process can be, for example, a CMP process. Alternatively, the subsequent MEMS beam could be directly formed over the cavity shown in FIG. 5, without the reverse planarization of the oxide layer shown in FIG. 6.

Figure 7:
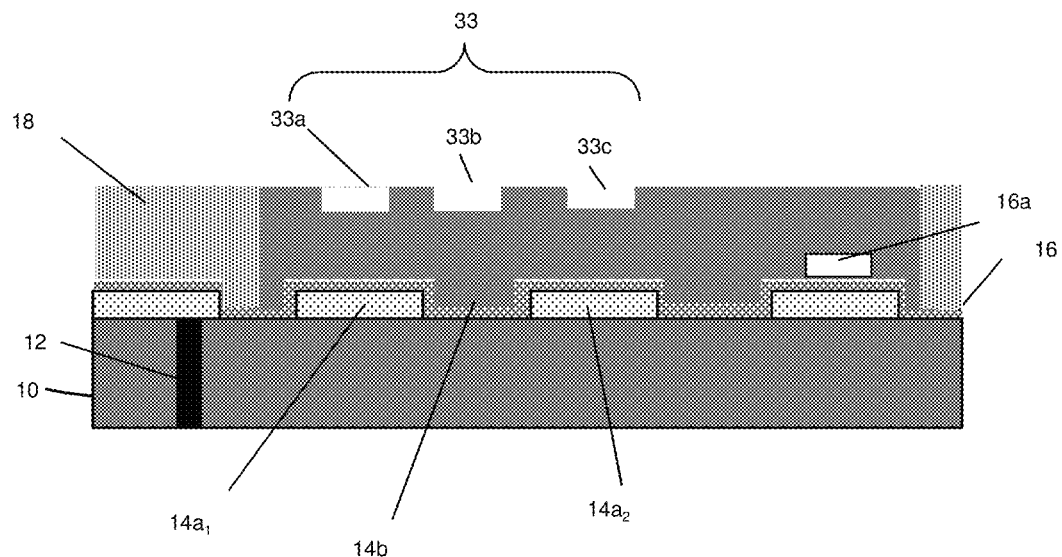

In FIG. 7, an array of trenches 33, e.g., array of trenches 33a, 33b, 33c, etc., are formed in the layer 18, over respective wires and/or aligned with spaces 14b. It should be noted that each trench 33a, 33b and 33c is representative of an array of trenches, and can be formed at other locations as described below. In embodiments, the array of trenches 33 are formed by conventional patterning and etching processes. To ensure that the silicon (e.g., layer 18) is uniformly etched, an optional oxide RIE process can be performed on the resist patterned wafers prior to silicon etch. In addition, with or without the optional oxide RIE process, a HF clean with photoresist on the wafer can be performed to hydrogen passivate the silicon surface, e.g., surface of silicon layer 18, prior to etching the silicon. Silicon is etched for example, using a SF$_6$-based RIE chemistry, as known in the art. Alternatively, the optional oxide RIE process, using perfluorocarbon gases such as CF$_4$ and an oxidizer such as CO$_2$, as known in the art, which can etch 50 nm or more of silicon (or other sacrificial material), can be used to etch the silicon. Oxide RIE etching can, for example, be performed in a parallel plate rf reactor using one or more perfluorocarbons and an oxygen source, such as oxygen or carbon dioxide, as known in the art.

In embodiments, the array of trenches 33 can be formed at different locations, alone or in any combination. For example, the trenches 33a can be formed over an actuator wire 14a$_1$; whereas the array of trenches 33b can be formed in alignment with a space 14b between the actuator wires 14a$_1$ and dummy wires 14a$_2$. In embodiments, the trenches 33c can also be formed over dummy wires 14a$_2$. In further embodiments, any of the trenches 33 can be formed in alignment with a space or opening of the MEMS beam, as described in further detail below.

In further embodiments, the array of trenches 33 are formed to a depth of about 10 nm to 100 nm and about 0.1 to 1 µm wide in the layer 18 (e.g., sacrificial cavity material); although other dimensions are contemplated by the invention depending on the design parameter. These trenches 33 will form mini-bumps to block actuator contact. If there is topography on the surface of metal layers 14 or on the underside of metal layer 38 (FIG. 10) such as metal hillocks, then the mini-bumps could be slightly taller than this topography, to prevent actuator contact due to topography. For example, depending on the location, the trenches 33 can vary in size, e.g., deeper and wider or shallower and narrower, in order to form varying sizes of actuator bumps (e.g., oxide pegs). More specifically, the trenches can vary in depth and width (or circumference) depending on their location with respect to the actuator region and contact region of the underlying electrodes (e.g., wires), as discussed in more detail below. In one exemplary embodiment, the trenches 33 are 0.5 micron wide, designed in a circular shape, and 50 nm deep.

Figure 8:
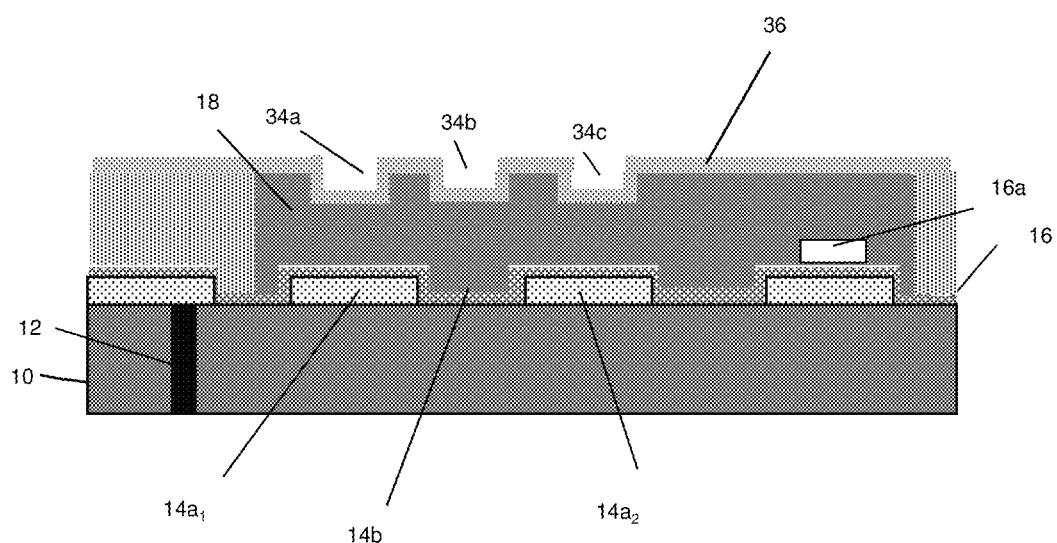

In FIG. 8, the dielectric such as SiO$_2$ is deposited over the array of trenches 33. In embodiments, insulator layer 36 forms part or all of the MEMS capacitor dielectric. A dielectric layer 36, e.g., oxide, is formed on the layer 18 and insulator layer 20. In embodiments, the dielectric layer 36 is an upper capacitor dielectric or oxide deposition, which is formed on a bottom portion of the MEMS beam. In embodiments, the MEMS capacitor dielectric 36, when the MEMS beam is actuated, comprises dielectric layers 16 and 36, which are separated by a small gap, due to the surface roughness of the MEMS capacitor electrodes. In embodiments, the dielectric layer 36 can be deposited to a height of about 80 nm; although other dimensions are contemplated by the present invention. In embodiments, the dielectric layer 36 can be formed prior to the formation of the actuator bumps 34a, 34b, 34c, etc.; that is, the subsequent dielectric layer 40 (FIG. 10) can be deposited in the trenches 33.

The insulator material 36, combined with subsequent materials, will form an array of actuator bumps, e.g., actuator bumps 34a, 34b, 34c, etc., on an underside of the MEMS beam. In addition to preventing actuator stiction during MEMS cycling or hold down testing, in embodiments, the actuator bumps 34a, 34b, 34c, etc., as with the bumps 16a, provide a bumper between the MEMS beam and the lower wire level, e.g., wires, to prevent electrical arcing due to the close proximity of wires in the MEMS beam and the wires during MEMS operation; or reduce or eliminate the likelihood of actuator stiction. Arcing could occur when a high dc voltage, i.e., 5-100V, is applied to the MEMS actuator in, for example, the wires. In embodiments, an optional dielectric layer 36 can be formed on the layer 18 and within the array of trenches 33, prior to the formation of the actuator bumps 34a, 34b, 34c, etc. The layout of the mini-bumps shown in these and other cross-sectional views is arbitrary and, for the mini-bumps to prevent MEMS stiction, they are designed to avoid actuator contact, as will be described below as described in FIGS. 13-17.

The array of actuator bumps 34a, 34b, 34c, etc. are sized and shaped according to the different dimensions of the respective array of trenches 33. More specifically, the array of actuator bumps 34a, 34b, 34c, etc. are structured so as to provide a predetermined amount of physical spacing between the MEMS beam and an actuator electrode when a voltage is present on the actuator electrode; or they are positioned so that the grounded and dc biased actuators never come into physical contact. That is, the array of actuator bumps 34a, 34b, 34c, etc. are structured so as to prevent the dc biased actuators in the MEMS beam from contacting the fixed actuator electrode when a dc voltage is present on the actuator electrode. Also, in embodiments, the array of actuator bumps permit the MEMS beam to contact a contact electrode, e.g., capacitor electrode. In other words, the array of actuator bumps 34a, 34b, 34c, etc. are dimensioned, e.g., sized and spaced, so as to ensure that the MEMS beam can contact the fixed contact electrode during actuation, i.e., application of a voltage on the actuator electrode. These same advantages are also seen from the actuator bumps 16a. Although the present invention refers to using a dc voltage to actuate the MEMS, the present invention also contemplates the use of dc, ac, and/or rf voltage since the attractive force between biased actuators is proportional to the square of the voltage. Although the present invention focuses on the use of mini-bumps to prevent actuator stiction, the mini-bumps can also be used to prevent capacitor head stiction, which might decrease the actuated beam capacitance due to larger spacing between the MEMS beam and fixed wire level capacitor heads.

Figure 9:
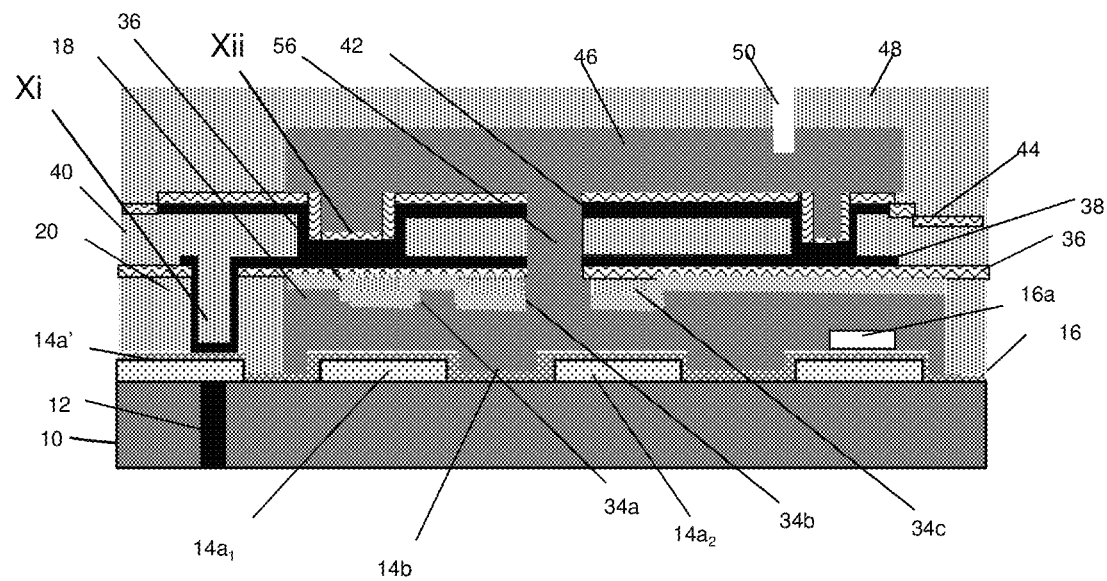
Figure 10:
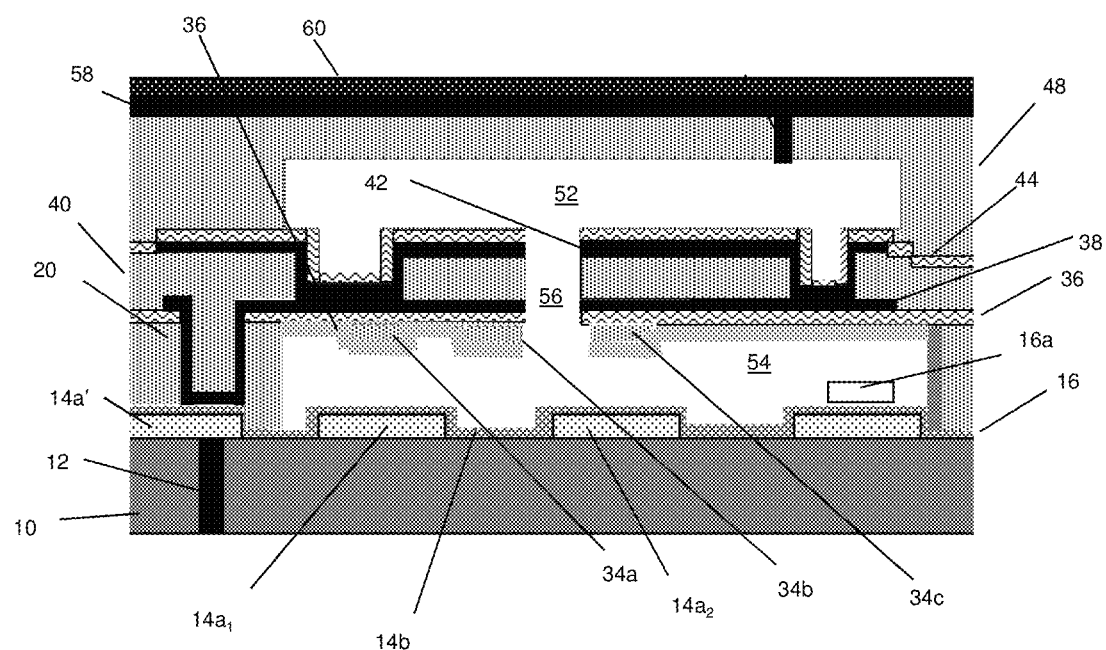

FIGS. 9 and 10 show additional processing steps and respective structure in accordance with aspects of the present invention to form the MEMS beam, upper MEMS cavity, and lid. A via Xi can be formed in the insulator layers 20 and 36 to the underlying wire 14a'. The via Xi can be a tapered via formed using conventional lithographic, etching, and cleaning processes, or any other type of via such as a damascene tungsten stud as known in the art. The use of a tapered via reduces the CMP exposure of the silicon surface, resulting in less silicon thickness variability, avoiding polishing or damaging the upper MEMS capacitor insulator, as well as a lower chance of forming a deep divot. In embodiments, care should be taken with the tapered via not to overly oxidize the underlying TiN, TiAl₃, or AlCu surface, which can cause high via resistance. Optionally, the post via RIE photoresist strip can be performed at low temperature, i.e., 100° C., to minimize oxidization or by using a wet chemical strip of the photoresist.

In embodiments, the via Xi should be used outside of the silicon cavity area, because the oxide etch used to fabricate it would be blocked by the layer 18 if it was placed inside the silicon cavity. In embodiments, if the subsequent metal deposition process has poor conformality or side wall coverage, than the aspect ratio of tapered via should be low, e.g., 0.5:1. For example, for a 2 μm thick insulator 20, a 4 μm wide tapered via could be used. Alternatively, if a conformal aluminum process, i.e. a hot reflow PVD or CVD process, was used, than a higher aspect ratio could be used for tapered via. Alternatively, a damascene tungsten stud via could be fabricated, as is known in the art.

Still referring to FIG. 9, a subsequent metal layer 38 is formed and patterned on the insulator material 36 and within the via. In embodiments, the metal layer 38 is used to form the MEMS beam lower electrode. The metal layer 38 can be deposited and patterned to cover the actuator bumps 34a, 34b, 34c, etc., or in additional embodiments, to leave it uncovered, or both. If the actuator bumps 34a, 34b, 34c, etc. are uncovered, then the likelihood of stiction, arcing, or other dielectric damage between the actuator plates is reduced or eliminated. If the actuator bumps 34a, 34b, 34c, etc. are not covered by the metal layer 38 and there is a step down into the actuator bumps 34a, 34b, 34c, etc. due to process method chosen, then there may be a thin metal spacer left along the sidewall of the actuator bumps 34a, 34b, 34c, etc. The metal layer 38 will also be formed in the via, in contact with the wire (electrode) 14a'. In optional embodiments, the metal layer 38 can also be deposited in the trenches 33 or above the trenches 33 in direct contact with the material 34 in the trenches.

In embodiments, the metal layer 38 can be TiN, TiN or W, Ru, Pt, Ir, amongst other materials. The thicknesses of this and other electrodes and/or wires can vary depending on the specific design parameters. For example, Ti/AlCu/Ti/TiN layers could be used with 10 nm, 5000 nm, 10 nm, and 32 nm thickness, respectively, which would form TiAl₃ under and over the AlCu after 400° C. annealing. To minimize any hillocks, in embodiments, an optional Ti layer may be deposited and/or formed in direct contact with Al. In this case, the hillocks should be suppressed on the lower surface of the metal layer (electrode) 38, as opposed to the upper surface. Alternatively, the metal layer 38 could be formed from a noble metal, such as Au; or a refractory metal, such as W or Ta; or without a Ti—AlCu interface, e.g., Ti/TiN/AlCu/TiN.

An insulator material 40 is conformally deposited over the metal layer 38. In embodiments, the insulator material 40 is a deposited oxide using any of the methods discussed above. In embodiments, the insulator material 40 is deposited to a height of about 0.5 to 5 μm, depending on the beam spring constant and oxide to metal thickness ratio requirements. In one exemplary embodiment, insulator material 40 is 400° C. PECVD 2 μm oxide and has a well controlled residual stress and thickness. In embodiments, vias are formed in the insulator material 40, to expose portions of the underlying metal layer 38 in a fashion similar to the vias previously described in the insulator layer 20. Variation in the thickness of the insulator layer 40 or residual stress results in spring constant and stress gradient variability in the overall MEMS beam, which can negatively affect the beam curvature and bending.

An upper electrode (metal layer) 42 is formed and patterned over the insulator layer 40, and also deposited within the vias Xii to contact the lower electrode (metal layer) 38. In embodiments, the upper electrode 42 is formed from the same materials as the lower electrode 38. For example, in one exemplary embodiment, the electrodes 38 and 42 are composed of. Ti/AlCu/Ti/TiN. For the tapered vias, it may be desirable to fully remove the TiN layer prior to depositing the metal for the electrodes 38 and 42, i.e., Ti/AlCu/Ti/TiN, by either etching it using a TiN RIE chemistry, sputter it using an argon sputter, or a combination of both to eliminate the potential for via resistance high flyers. The metal volume of the electrodes 38 and 42 should be the same or substantially the same in order to balance the overall volume and stress of the device, and hence not place undue stresses on the beams of the MEMS structures, as discussed in U.S. application Ser. No. 12/974,854.

Still referring to FIG. 9, an optional insulator material 44 is deposited on the upper electrode 42 and exposed portions of the insulator material 40. In embodiments, the insulator material 44 is deposited to a thickness of about 80 nm; although other dimensions are also contemplated by the present invention. To balance the MEMS beam, the insulator material 44 over the MEMS beam should be substantially the same thickness as the insulator material 36 under the MEMS beam. This thickness balancing of layers 36 and 44 should include any additional dielectric deposition on layer 44 that occurs during the subsequent vent hole dielectric deposition sealing step. A cavity via is formed through the insulator materials, 44, 40 and 36 to the underlying layer 18 by patterning and etching through the insulators. In embodiments, any unwanted oxide, such as a native oxide which is formed by exposing the layer 18 to air, can be cleaned using, for example, an HF acid, prior to the subsequent material deposition.

FIG. 9 further shows a layer 46 deposited on the insulator material 44 and within the via(s), extending to underlying layer 18. In embodiments, the layer 46 is the same material as the layer 18, e.g., silicon, which can be deposited to a thickness of about 4 μm; although other dimensions are also contemplated by the present invention. In embodiments, due to the HF acid cleaning, there will be no oxide between the two layers of silicon (e.g., layer 18 and layer 46). Alternatively, any sacrificial cavity material could be used, such as a spin-on polymer.

The layer 46 may deposited such that the topography of the layer 46 changes in accordance with the underlying features, e.g., forming regressive openings. To avoid certain topography that would result in MEMS beam pinning, the deposition of the layer 46 should be optimized. This can be accomplished by depositing a thick layer 46 to pinch off or partially pinch off any vias formed with regressive openings, or through a CMP process followed by a subsequent silicon deposition, or a combination of the above. As an illustrative, non-limiting example, the layer 46 has a 3 μm initial thickness, undergoes a 1 μm CMP removal, and has a second silicon deposition to achieve the 4 μm thickness. In an optional embodiment, the layer 46 can undergo an optional lithographic and RIE process using a reverse mask, similar to that discussed above.

As further shown in FIG. 9, an insulator (oxide) material 48 can be deposited on the material 46 and any exposed insulator material 44. The material 48 can be planarized such that material (e.g., oxide) is left over layer 48, or can be planar with the underlying layer 48. Whether or not the layer 48 is planarized back to the surface of layer 46, additional dielectric may need to be deposited to form the required oxide lid thickness over the MEMS cavity, as discussed below. Alternatively, the insulator material 48 can be partially planarized or left unplanarized. As an optional step, the insulator material 48 can be deposited to a thickness of about 5 μm, compared to the 2.3 μm, with a Si layer, for example, deposited on the thick oxide material.

The Si layer (and portions of the insulator material 48) are planarized using conventional processes such as, for example, CMP. The deposition of the insulator material 48 should sufficiently fill the wire level spaces such that voids in the oxide do not intersect the CMP planarized oxide surface by, for example, deposition the initial oxide film with HDPCVD oxide to fill the spaces, deposition/etch/deposition oxide, or PECVD TEOS-based oxide, either for the initial oxide deposition or the entire film. With all of these embodiments, the reverse pattern etch back step is optional. An additional oxide material can also be deposited to determine the lid thickness before silicon venting. The oxide material can have a thickness before venting of about 3 μm, for example.

In embodiments, a vent hole 50 is patterned and opened in the lid 48, exposing a portion of the underlying layer 46. It should be understood that more than one vent hole 50 can be formed in the insulator material 48. The vent hole 50 can be formed using conventional lithographic and etching processes known to those of skill in the art. The width and height of the vent hole 50 determines the amount of material that should be deposited after silicon venting to pinch off the vent hole. In general, the amount of material that should be deposited to pinch off the vent hole 50 decreases as the vent hole width decreases; and as the vent hole aspect ratio, which is the ratio of the vent hole height to width, increases. In embodiments, a 3 μm thick pre venting lid would have a 1 μm diameter.

The vent hole 50 may be circular or nearly circular to minimize the amount of subsequent material needed to pinch it off. In one exemplary embodiment, the vent hole 50 is shaped in an octagon, which minimized the computational requirement as discussed above. In one exemplary embodiment, approximately 1 μm of oxide lid is required per 10,000 μm$^2$ of cavity area to avoid lid cracking after venting. The vent holes 50 can be formed at several locations, to portions (expose portions) of the upper layer 46, the lower layer 18 or both the upper and lower layers 46, 18. For example, the vent holes are formed both inside and outside the cavity vias 56.

In FIG. 10, the sacrificial layers 46 and 18 are vented or stripped by way of the vent hole 50. In embodiments, the structure, and in particular, the exposed underlying layer 46, can be cleaned with an HF solution prior to venting to remove the native oxide and hydrogen passive the exposed silicon surface passivate the surface of the layer 46. In embodiments, the stripping (e.g., etching) can be performed using a XeF$_2$ etchant through the vent hole 50. The etching will strip all of the material (silicon) forming an upper cavity or chamber 52 and a lower cavity or chamber 54, and is selective to many other materials, including SiO$_2$. In embodiments, the etch rate of the layer 46 in the upper portion 52 will etch faster than the layer 18 in the lower portion 56, thus ensuring that no undue stress is placed on the lower portion 56. (The upper portion 52 and lower portion 54 will form the upper cavity and lower cavity of the MEMS structure.)

As shown in FIG. 10, the vent hole 50 can be sealed with a material 58, such as a dielectric or metal. To avoid the problem of sealing material entering the cavity and depositing on the MEMS beam, in embodiments, the vent holes 50 should be placed far enough away from the vias, e.g., greater than 1 μm or, in an exemplary embodiment, greater than 5 μm, so that released MEMS beam is not bonded to the lid by the vent sealing deposition. Alternatively, the vent holes 50 can be placed in cavity areas away from the MEMS beam, so that no vent hole sealing material is deposited on the released MEMS beam. Optional layer 60 is deposited next to provide a hermetic seal. The layer 60 could be, for example, a 500 nm PECVD silicon nitride film or other films known to provide a hermetic seal over oxide layer 62.

FIG. 11 shows a side cross sectional view in accordance with an aspect of the present invention. In particular, FIG. 11 shows an array of actuator mini-bumps 34 extending downward from the MEMS beam 75, and in alignment with actuator electrodes $14a_1$. In embodiments, the array of actuator mini-bumps 34, upon actuation of the MEMS beam, e.g., application of voltage, will contact (land on) the actuator electrodes $14a_1$, thereby ensuring that the actuator portion of the MEMS beam 75 will be physically separated from the actuator electrodes $14a_1$; however, the array of actuator bumps 34 are sized and shaped so as to allow the capacitor head portion of MEMS beam 75 to contact the contact region $14a_2$ of the electrodes. In embodiments, the actuator bumps 34 can be about 0.5 μm in width and about 50 nanometers in height. In further embodiments, a majority of the array of actuator bumps 34 can be of a same size and shape, with deeper (wider and/or longer) actuator bumps 34a placed farthest away from the contact regions $14a_2$ and narrower actuator bumps 34 closer to the contact region $14a_2$, e.g., capacitor head.

FIG. 11 also shows an optional large bumper Xiii, which could be placed in addition to the mini-bumps 34. If the optional large bumper Xiii was placed, then an additional lithography, etch, and clean step would need to be performed immediately before or after forming of the trenches 33a, 33b, and 33c or wider bumpers could be used as shown below.

FIG. 12 shows a side cross sectional view in accordance with an aspect of the present invention. In particular, FIG. 12 shows an array of actuator bumps 34 extending downward from the MEMS beam 75, and in alignment with actuator electrodes $14a_1$ In the embodiment of FIG. 12, the array of actuator bumps 34 can have variable widths and variable depths. Although random variable depth is shown, it could be desirable to place shallower mini-bumpers on the actuators near the capacitor head, to minimize or eliminate any reduction in capacitance caused by the mini-bumps over the actuators, and deeper mini-bumps further away from the capacitor head; or place shallower mini-bumps on the capacitor head and deeper mini-bumps on the actuators, to reduce stiction on the actuators due to the dc actuation voltage and stiction on the capacitor head due to the rf voltage.

As shown in the accompanying chart, the varying dimensions, e.g., widths, can be obtained by variable etch rates during the fabrication of the array of actuator bumps. For example, about 0.5 and 2 micron wide mini-bumps will etch at 0.4 and 0.8 microns per minute, respectively. Also, about 0.5 micron wide 25 nm deep mini-bumps could be placed immediately adjacent to the capacitor head $14a_2$ and 2 micron wide 50 nm deep mini-bumps could be placed further away from the capacitor head $14a_2$, to allow for closer capacitor head contact between the fixed wire $14a_1$ and the MEMS beam wire 38 to increase the actuated MEMS capacitance. The variable widths can range, for example, from about 0.1 μm to about 5.0 μm; although other dimensions are contemplated by the present invention.

In embodiments, due to the different dimensions, some of the array of actuator bumps 34 will contact the actuator electrodes $14a_1$, thereby ensuring that the MEMS beam 75 will be physically separated from the actuator electrodes $14a_1$; however, the array of actuator bumps 34 are sized and shaped so as to allow the MEMS beam 75 to contact the contact region $14a_2$ of the electrodes. In embodiments, the varying depths and/or widths can be formed by two or more masking steps.

In embodiments, the mini-bumps 34 are placed in holes, openings, or spaces inside the lower MEMS wire 38 to prevent the voltage biased MEMS beam actuator from contacting the voltage biased fixed actuator $14a_1$. MEMS beam stiction occurs when an electric field flows between two MEMS actuators and increases as the electric field increases. If the mini-bumps are placed in holes inside the lower MEMS wire 38, then the electric field between the MEMS wire 38 and fixed actuator wire $14a_1$ is significantly reduced when the mini-bump under the MEMS beam wire 38 contacts the fixed actuator wire $14a_1$. This means that the mini-bumps contact the surface of the fixed actuator wires $14a_1$.

Figure 13:
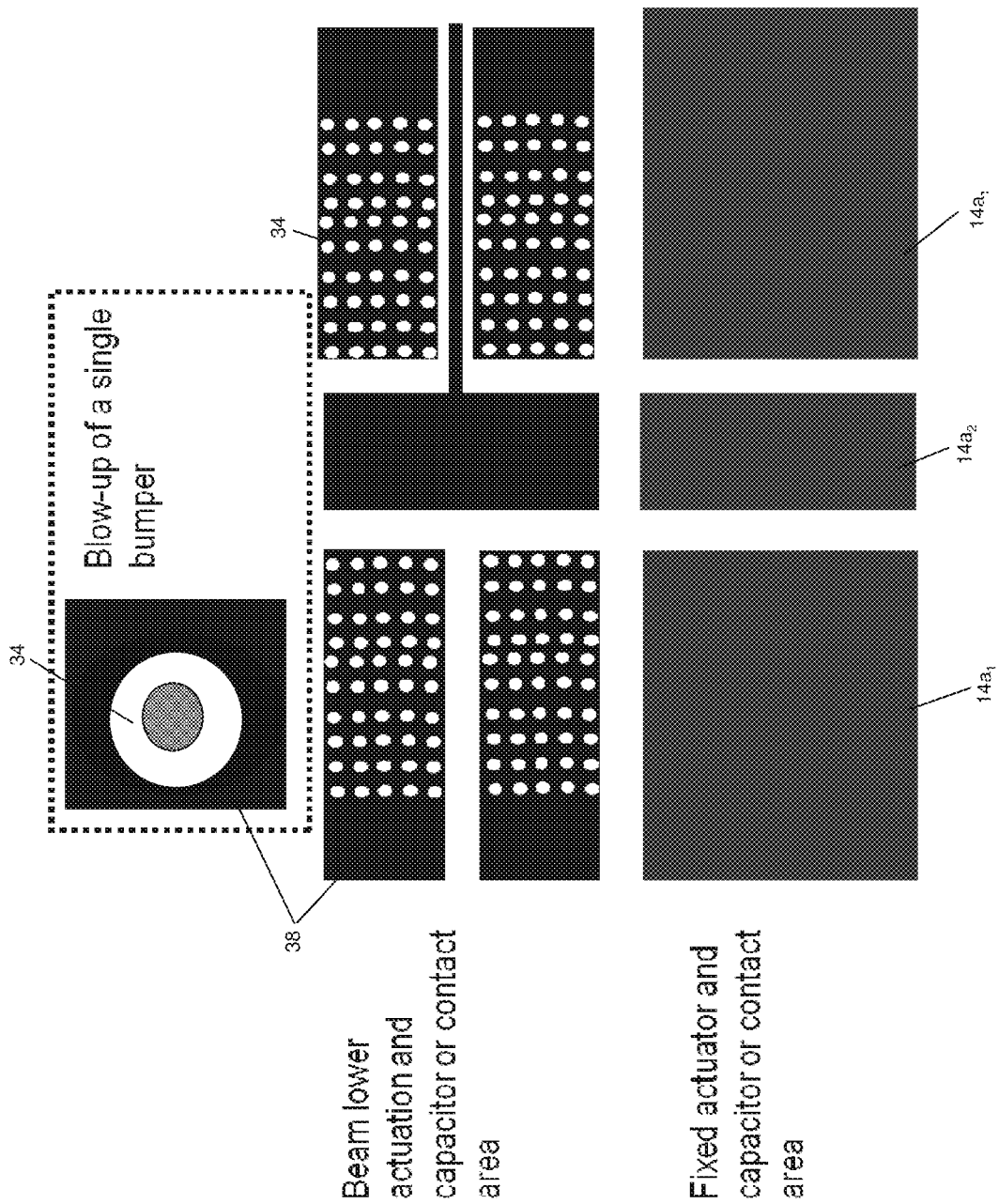
FIG. 13 shows a top view of the structures of either FIG. 11 or FIG. 12 in accordance with aspects of the present invention.

FIG. 13 shows a top view of the structures of either FIG. 11 or FIG. 12 in accordance with an aspect of the present invention. In particular, FIG. 13 shows an array of actuator bumps 34 extending from a lower electrode 38 of the MEMS beam, and in alignment with actuator electrodes $14a_1$. As shown, the array of actuator bumps 34 will land on the actuator electrodes $14a_1$, upon application of voltage, thereby ensuring that the lower electrode 38 of the MEMS beam will be physically separated from the actuator electrodes $14a_1$; however, the array of actuator bumps 34 are sized and shaped so as to allow the lower electrode 38 of the MEMS beam to contact the contact region $14a_2$ of the electrodes.

Figure 14:
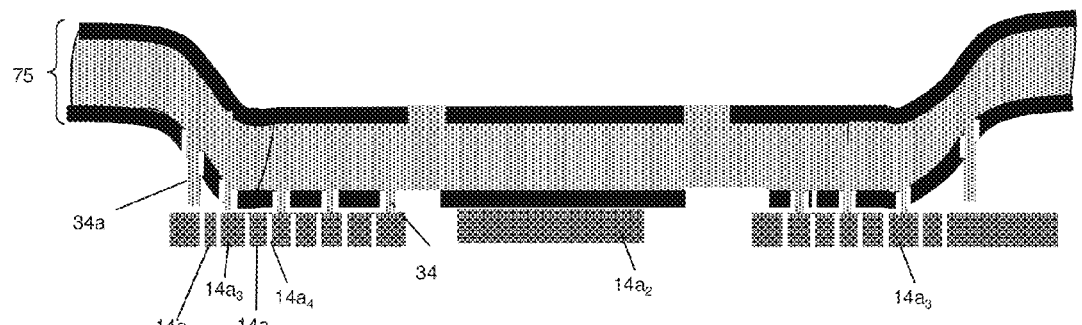
FIG. 14 shows a side cross sectional view of a MEMS structure in accordance with an additional aspect of the present invention.

FIG. 14 shows a side cross sectional view in accordance with an aspect of the present invention. In particular, FIG. 14 shows an array of actuator bumps 34 extending downward from the MEMS beam 75, and in alignment with isolated actuator electrodes $14a_3$. In any of the embodiments, the isolated actuator electrodes $14a_3$ can be, for example, (i) dummy conductors individually electrically floating, (ii) connected dummy conductors but electrically floating, (iii) dummy conductors individually electrically floating or connected but electrically floating, or (iv) connected to a voltage such as ground or any combination of known ac and dc voltages. In embodiments, the known voltage can be equal to the beam actuator voltage, as one example.

In the embodiment of FIG. 14, in operation, the array of actuator bumps 34 will land on the isolated actuator electrodes $14a_3$. In this way, the array of actuator bumps 34 will ensure that the actuators in the MEMS beam 75 will be physically separated from the fixed actuator electrodes; however, the array of actuator bumps 34 are sized and shaped so as to allow the capacitor head in the MEMS beam 75 to contact the capacitor contact $14a_2$ of the electrodes. These dummy contact regions $14a_3$ can be electrically floating, biased at the same voltage potential as the MEMS beam actuator, or biased at any voltage. Preferably, the dummy contact regions $14a_3$ are left electrically floating or are biased at the same voltage as the MEMS beam actuators. As in the previous embodiments, the array of actuator bumps 34 can also have varying widths and depths, by adjusting etch rates during the fabrication of the array of actuator bumps. Again, the widths can range, for example, from about 0.4 μm to about 5.0 μm; although other dimensions are contemplated by the present invention. This embodiment reduces the electric field between the lower MEMS wire 38 and the fixed actuator wire 34 in the areas of physical contact because there is no voltage difference between the lower MEMS wire 38 and the dummy shape in the fixed actuator wire 34.

Figure 15:
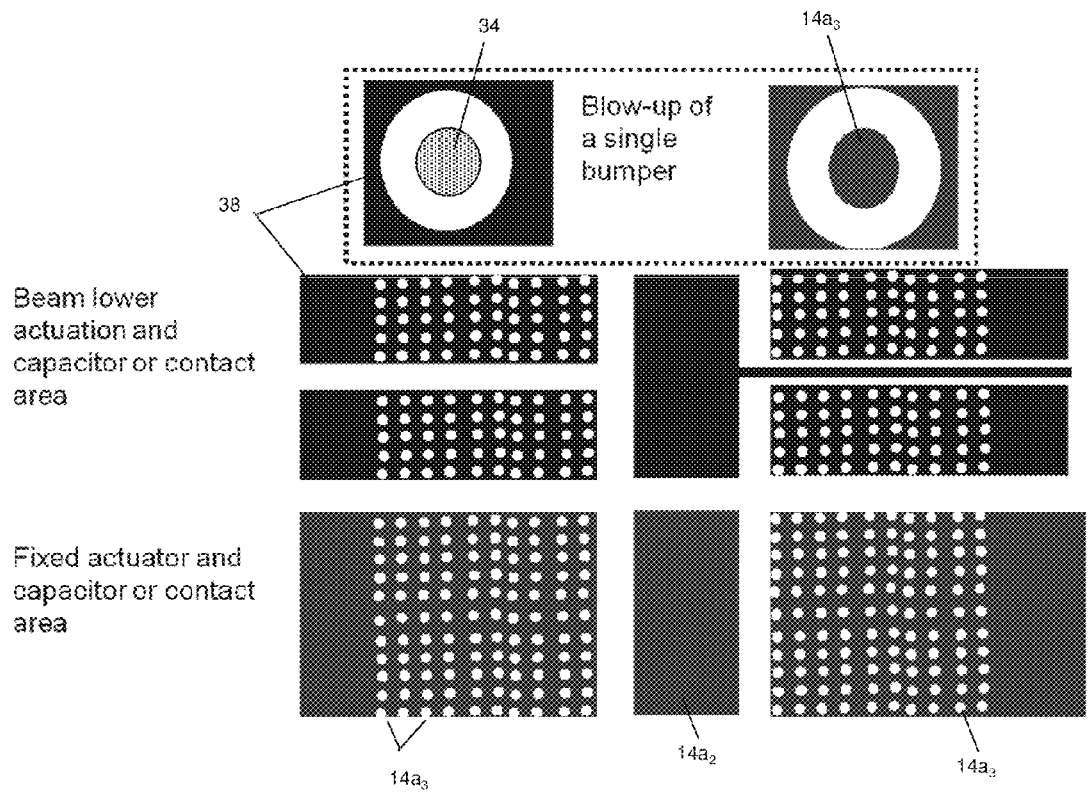
FIG. 15 shows a top view of the structure of FIG. 14.

FIG. 15 shows a top view of the embodiment shown in FIG. 14. In particular, FIG. 15 shows an array of actuator bumps 34 extending downward from the lower electrode 38, and in alignment with isolated actuator electrodes $14a_3$. As shown, the array of MEMS beam actuator bumps 34 will land on the actuator electrodes spaces 14$a_3$, upon application of voltage, thereby ensuring that the lower electrode 38 of the MEMS beam will be physically separated from the actuator electrodes; however, the array of actuator bumps 34 are sized and shaped so as to allow the MEMS beam capacitor head portion of lower electrode 38 of the MEMS beam to contact the capacitor head contact region 14$a_2$ of the electrodes. In this embodiment, there is no physical contact of any kind between the biased MEMS beam and fixed actuator electrodes 14$a_5$.

Figure 16:
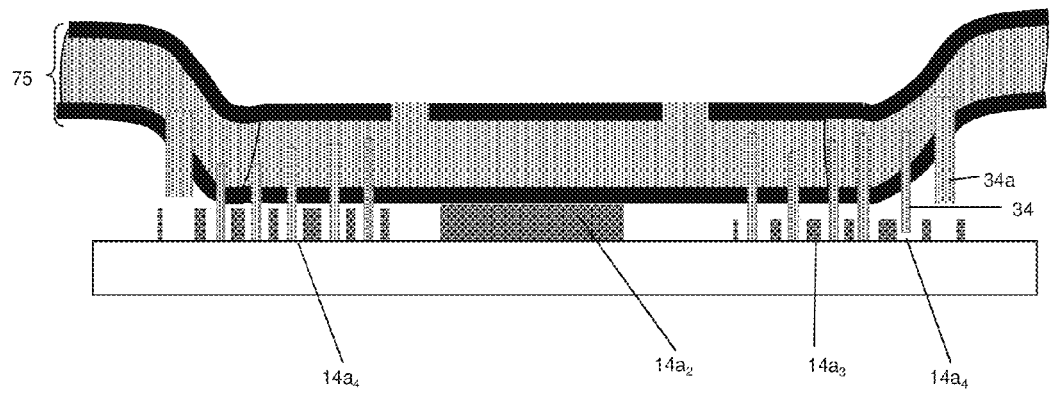
FIG. 16 shows a side cross sectional view of a MEMS structure in accordance with an additional aspect of the present invention.

FIG. 16 shows a side cross sectional view in accordance with an aspect of the present invention. In particular, FIG. 16 shows an array of actuator mini-bumps 34 extending downward from the MEMS beam 75, and in alignment with spaces 14$a_4$ between isolated actuator electrodes 14$a_3$. In the embodiment of FIG. 16, the array of actuator bumps 34 will land on the substrate 10 between the isolated actuator electrodes 14$a_3$. The array of actuator bumps 34 are sized, though, to ensure that the MEMS beam 75 will be physically separated from the actuator electrodes, while still making contact with the contact region 14$a_2$ of the electrodes. For example, if the fixed actuator wires are 250 nm tall, the mini-bumps 34 could be 300 nm tall to provide a 50 nm gap between the contacted MEMS beam and fixed actuators. As in the previous embodiments, the array of actuator bumps 34 can have varying widths and depths, by adjusting etch rates during the fabrication of the array of actuator bumps; although this embodiment shows a constant depth of the array of actuator bumps 34. Again, the widths can range, for example, from about 0.4 µm to about 5.0 µm; although other dimensions are contemplated by the present invention.

Figure 17:
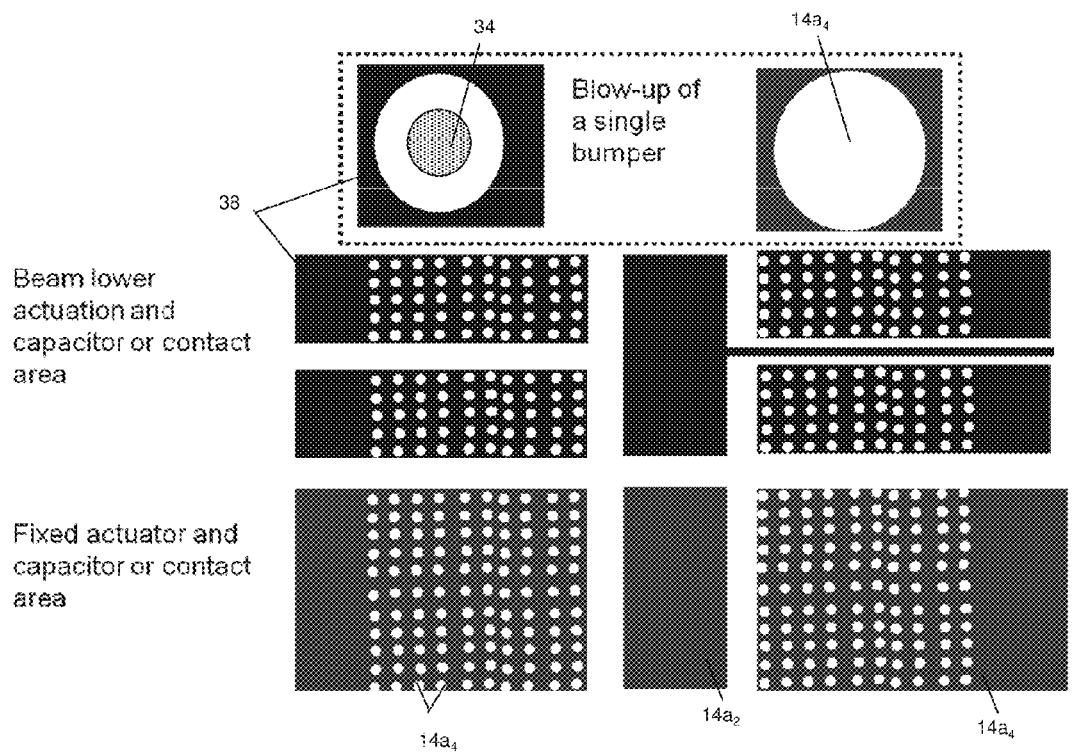
FIG. 17 shows a top view of the structure shown in FIG. 16.

FIG. 17 shows a top view of the embodiment shown in FIG. 16. In particular, FIG. 17 shows an array of actuator bumps 34 extending downward from the lower electrode 38, and in alignment with spaces 14$a_4$ between the isolated actuator electrodes 14$a_3$. As shown, the array of actuator bumps 34 will land between the spaces 14$a_4$ of the isolated actuator electrodes 14$a_3$, and contact the underlying substrate 10. The array of actuator bumps 34 are sized to ensure that the lower electrode 38 of the MEMS beam will be physically separated from the actuator electrodes, while also contacting the contact region 14$a_2$ of the electrodes.

FIGS. 18$a$ through 22$b$ show various configurations of the array of actuator bumps 34 and/or 16$a$. In particular, FIGS. 18$a$ through 22$b$ show a bottom electrode of the MEMS beam 75 in alignment with a lower, fixed actuator electrode 14". In these embodiments, the MEMS beam 75 and the underlying fixed actuator electrode 14" include insulator material, either fully encapsulated or partially encapsulated, as shown by the different cross hatchings. In FIGS. 22$a$ and 22$b$, the lower fixed actuator electrode 14" are formed on an insulator material or underlying substrate 10. Also, in each of the embodiments, the array of actuator bumps 34 and/or 16$a$ will land on insulator material of the respective MEMS beam 75 or lower fixed actuator electrode 14", or on an underlying substrate. In each of these embodiments, though, the array of actuator bumps 34 and/or 16$a$ prevents contact between the MEMS beam 75 and an underlying fixed actuator electrode 14". That is, the array of actuator bumps 34 and/or 16$a$ ensures that there is a physical space between the MEMS beam 75 and the underlying fixed actuator electrode 14".

In FIG. 18$a$, the array of mini-bumps 34 extend downward from the MEMS beam 75. In FIG. 18$b$, the array of mini-bumps 34 extend downward from the MEMS beam 75, and in alignment with an opening 75$a$ thereof. It should be understood that for the structures where the mini-bump 34 lands on a dummy shape or inside a hole 75$a$ in the wire, the width and mis-registration tolerances should be included in the layout. For example, if the mini-bump 34 is 0.5 microns wide and has a width tolerance of 0.1 micron and has a mis-registration tolerance of +/−0.1 micron, then the dummy feature it lands on should be about at least 0.7 microns wide to fully land the mini-bump or the hole it lands inside of greater than 0.7 microns wide. In one exemplary embodiment, the mini-bump width is 0.5 microns, the mis-registration tolerance is +/−0.1 microns, and the hole it lands inside width is 0.9+/−0.1 micron. The same logic applies to mini-bumps that land on dummy shapes, where it may be desirable to not have the mini-bump land on the corner of a dummy shape and it is desirable to have the mini-bump not land on the voltage biased active actuator.

In FIG. 18$c$, the array of mini-bumps 34 extend downward from the MEMS beam 75, in alignment with both the opening 75$a$ and an isolated (dummy) actuator electrode 14$a_3$. In embodiments, no voltage is applied to the isolated (dummy) actuator electrode 14$a_3$, and as the array of mini-bumps 34 are not directly over the actuator conductor, there is no electric field through the bumps and, as such, this embodiment avoids beam collapse over the actuator electrode. This same phenomena is also equally applicable when the array of mini-bumps 34 (or 16) are over a space or opening in the actuator electrode, e.g., see FIGS. 21$b$, 21$d$, 22$a$ and 22$b$.

In FIG. 18$d$, the array of mini-bumps 34 extend downward from the MEMS beam 75, in alignment with both the opening 75$a$ and opening 14$a_4$ between the fixed actuator electrode 14". FIGS. 18$e$ and 18$f$ are analogous to FIGS. 18$c$ and 18$d$ except the MEMS beam actuator is over the mini-bumps.

In FIG. 19$a$, the array of mini-bumps 16$a$ extend upward from the fixed actuator electrode 14", in alignment with the MEMS beam 75. In FIG. 19$b$, the array of mini-bumps 16$a$ extend upward from the fixed actuator electrode 14", in alignment with the opening 75$a$ of the MEMS beam 75. In FIG. 19$c$, the array of actuator beams 16 extend upward from the fixed actuator electrode 14", in alignment with an isolated portion 75$b$ of the MEMS beam 75.

In FIG. 20$a$, the array of mini-bumps 16$a$ are metal or metal alloy and extend upward from the fixed actuator electrode 14", in alignment with the MEMS beam 75. In FIG. 20$b$, the array of mini-bumps 16$a$ are metal or metal alloy and extend upward from the fixed actuator electrode 14", in alignment with the opening 75$a$ of the MEMS beam 75. In FIG. 20$c$, the array of actuator beams 16 are metal or metal alloy and extend upward from the fixed actuator electrode 14", in alignment with an isolated portion 75$b$ of the MEMS beam 75. In embodiments, the metal or metal alloy of the beams 16$a$ are preferably of the same material as the fixed actuator electrode 14", formed in the processes described above.

In FIG. 21$a$, the array of mini-bumps 34 are metal or metal alloy and extend downward from the MEMS beam 75. In FIG. 21$b$, the array of mini-bumps 34 are metal or metal alloy and extend downward from the MEMS beam 75, and in alignment with an opening 14"$a$ between the actuator electrodes 14". In FIG. 21$c$, the array of mini-bumps 34 are metal or metal alloy and extend downward from the MEMS beam 75, in alignment with both the isolated actuator electrode 14$a_3$. In FIG. 21$d$, the array of mini-bumps 34 are metal or metal alloy and extend downward from the MEMS beam 75, in alignment with the opening 14$a_4$ between the fixed actuator electrode 14".

In FIG. 22a, the array of mini-bumps 34 are metal or metal alloy and extend downward from the MEMS beam 75, in alignment with the isolated actuator electrode $14a_3$. In FIG. 22b, the array of mini-bumps 34 are metal or metal alloy and extend downward from the MEMS beam 75, in alignment with the opening $14a_4$ between the fixed actuator electrode 14".

FIGS. 23a-23d show different layouts for the fixed actuator electrode 14" and the MEMS beam. In these embodiments, the shapes of the different patterns are round; although other dimensions are also contemplated by the present invention such as, for example, oval, triangular, octagonal, square, pentagon, hexagon, septagon, octagon or other open shape. FIG. 23a shows the fixed actuator electrode 14" and an isolated actuator electrode $14a_3$. In embodiments, FIG. 23a can also be representative of the actuator bump 16a. A space $14a_4$ is provided between the fixed actuator electrode 14" and the isolated actuator electrode $14a_3$ (or actuator bump 16a). In embodiments, the isolated actuator electrode $14a_3$ (e.g., individually electrically floating) is about 5 µm and the space between the space $14a_4$ is also about 5 µm; although other dimensions are also contemplated by the present invention.

FIG. 23b shows the opening $14a_4$ in the fixed actuator electrode 14". In embodiments, the opening $14a_4$ is about 1.5 µm; although other dimensions are also contemplated by the present invention.

FIG. 23c shows an actuator bump 34 (of the array of bumps) extending from the lower wiring layer 38 of the MEMS beam. In this embodiments, the actuator bump 34 is about 0.5 µm. In FIG. 23d, the actuator bump 34 (of the array of bumps) extending from the lower wiring layer 38 of the MEMS beam, in alignment with opening 75a.

As should now be understood, MEMS actuator stiction during MEMS beam cycling or voltage hold down, in general, is reduced by reducing the actuator contact area or reducing the electric field between the MEMS beam and fixed actuator electrodes when they are in contact. As such, the present invention reduces or eliminates MEMS actuator stiction by designing the array of mini-bumps to reduce the contact area of the actuators such that only the mini-bumps are in contact. In addition, the electric field across the actuator oxide between contacted MEMS beam and fixed actuators can be reduced, by not placing electrically biased actuator wiring over and/or under the mini-bumps; and the electric field across the actuator oxide can be eliminated by landing the mini-bumps on dummy shapes. This is summarized for the FIGS. 18-22 layouts in Table 1 below.

TABLE 1

| Reduced contact area only | Reduced contact area and electric field through contacted actuator oxide | Reduced contact area and eliminated electric field through contacted actuator oxide |
|---|---|---|
| Representative structures shown in FIGS. 18a, 19a, 20a and 21a. | Representative structures shown in FIGS. 18b, 19b, 20b and 21b. | Representative structures shown in FIGS. 18c, 18d, 18e, 18f, 19c, 20c, 21c, 21d, 22a and 22b. |

Figure 25A:
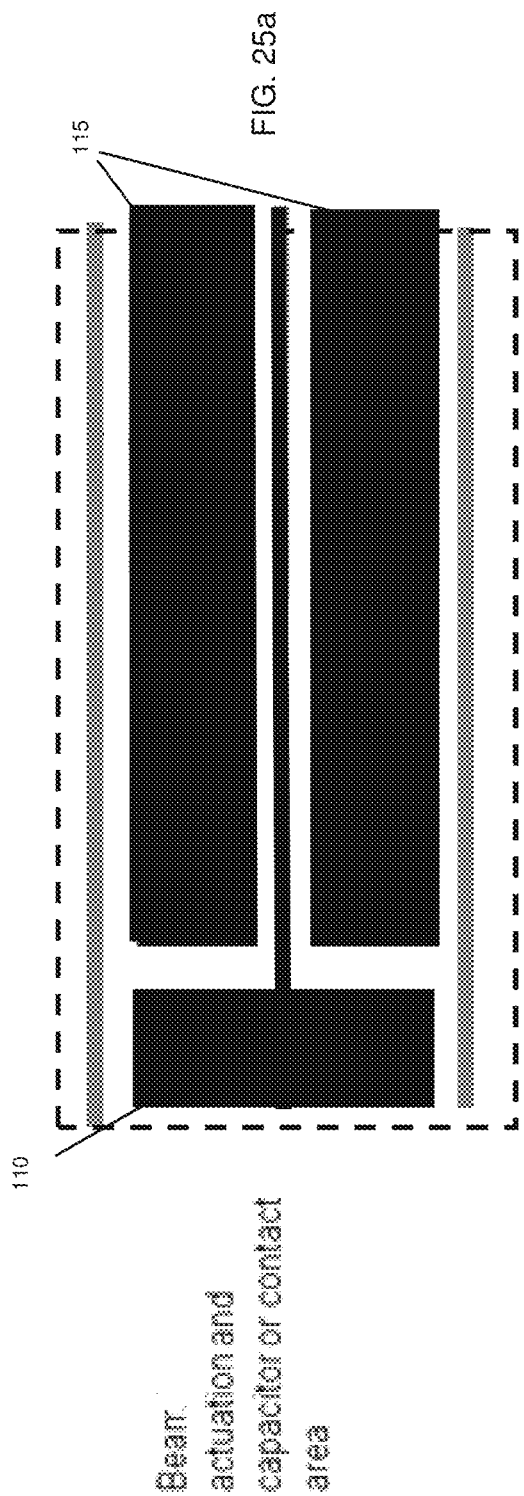
FIGS. 25a and 25b show top views of different cross sections of a MEMS cantilever structure fabricated in accordance with aspects of the present invention.
Figure 25B:
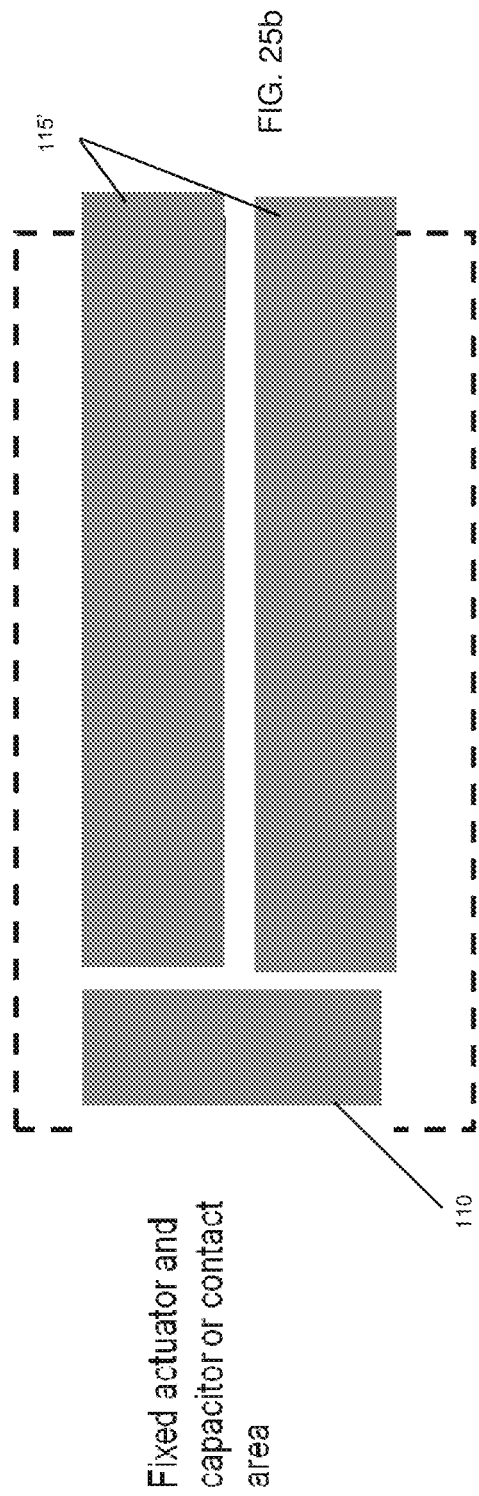

FIGS. 24a, 24b, 25a and 25b show various top views of the structures fabricated in accordance with aspect of the present invention, showing four terminal MEMS devices with separate electrodes for actuation and signal. Actuation, for example, could be a dc voltage bias and signal could be a rf signal. FIGS. 24a and 24b show top views of a first structure in accordance with the invention, which is a bridge MEMS beam; whereas, FIGS. 25a and 25b show different top cross sectional views of a second structure in accordance with the invention, which is a cantilever MEMS beam. These drawings are simplified and could include lateral springs or other structures to improve MEMS electrical performance or reliability, as known in the art.

In both cases the MEMS beam includes metal/insulator/metal with an added optional thin insulator layer under and over the stack if the MEMS device is a capacitor. To form a MEMS capacitor, an insulator is required on at least one of the electrodes that come into contact. One exemplary embodiment would use 0.5 µm lower and upper metal thickness and 2 µm insulator thickness with 80 nm insulator layer over and under the beam if the device was a capacitor. In addition, the actuators in either the MEMS beam or the fixed wires under the MEMS beam would be connected to ground, so that, when the actuation voltage is applied between the actuators that are not grounded, the MEMS beam would actuate and bend down, as known in the art. In another embodiment, the actuators and capacitor fixed wiring levels and/or MEMS beam wiring levels would be connected together and would need to be grounded using a dc ground, such as an inductor. This embodiment, which would use a simpler layout with combined actuator and capacitor head design, results in higher capacitor head or ohmic contact head area but causes the rf or ac signal and the dc actuation voltage to both be applied to the capacitor head or ohmic contact. In this embodiment, an optional inductor could be connected in to provide a dc ground and ac open, as known in the art.

In either of these scenarios, the array of actuator bumps will prevent the MEMS beam actuator from contacting the actuator electrodes. The array of actuator bumps also substantially reduce the likelihood of beam stiction after repeated cycling. In addition, this array of actuator bumps may increase the overall life the MEMS beam, for example, by reducing arcing.

FIGS. 24a and 24b show top views of different cross sections of a MEMS bridge structure fabricated in accordance with aspects of the present invention. As shown in FIG. 24a, the MEMS beam comprises one or more layers of metal sandwiched between a thin dielectric; FIG. 24b shows a fixed wiring level at the bottom of the cavity under the MEMS beam. The central area of the beam and fixed wire level is the capacitor head. In embodiments, the central area of the beam and fixed wire level could be exposed metal to form an ohmic contact. Inside the MEMS cavity but offset from the capacitor head are actuators. When a sufficient dc voltage is applied to between the actuators in the MEMS beam and fixed wire level, the MEMS beam collapses such that the beam capacitor head comes into contact with the fixed wire level capacitor head, which significantly increases the capacitance between the capacitor heads. A similar configuration can be used to form an ohmic contact switch, which requires exposed metal contacts instead of capacitor heads.

Although a bridge beam is shown in FIGS. 24a and 24b, MEMS devices can be formed with cantilever or any movable beam configuration. For example, a cantilever beam configuration is shown in, for example, FIGS. 25a and 25b with actuators 115 and 115' and a capacitor head 110. It should be understood that any wires in the MEMS beam should be routed to the fixed end(s) of the MEMS beam. Wires in the fixed wire under the MEMS beam can be connected to vias under the wires or routed in the same plane as the wires.

FIGS. 26a and 26b show top views of different cross sections of a MEMS bridge structure fabricated in accordance with aspects of the present invention. Like elements in FIGS. 26a and 26b and FIGS. 24a and 24b are labeled similarly and a detailed discussion of such like elements is not provided herein.

The MEMS beams shown to date have been either rigidly fixed on both ends (bridge beams) or rigidly fixed on one end (cantilever beams). In FIG. 26a, though, it is shown that bridge beams 195 can have narrow bendable wires 200 on one or both ends (lateral springs or springs) which are useful to reduce the temperature-induced variability in beam shape due primarily to the metal stress being proportional to temperature. If, for example, a MEMS bridge beam is not symmetric on the ends and, for example, has a lateral spring 200 on one end straight wires on the other, the lateral spring 200 can flex laterally as the MEMS beam is heated or cooled, which reduces undesirable bending caused by the thermal expansion coefficient differences between the metal in the beam and the surrounding oxide and silicon substrate or by residual stress in the MEMS beam.

If the residual stress in the MEMS beam films are not zero, then a MEMS beam which is constrained on one end by a lateral spring will flex the spring after it is released, due to the compressive or tensile stress of the MEMS beam. For example, after release of a MEMS beam with a lateral spring on one end, the spring could flex by 1 micron, which means that features in the MEMS beam near the spring, e.g., loop spring, will be moved 1 micron away from the loop spring with respect to the fixed wire under the MEMS beam; and features at the other end of the MEMS beam will not move with respect to the fixed wire under the MEMS beam. MEMS beam with lateral springs on both ends could flex at both ends of the beam, again resulting in misalignment between features in the MEMS beam and the fixed wire under the MEMS beam. If oxide bumpers are used to block actuator contact and they need to land on specific features, then this shift in the MEMS beam away or towards the lateral spring 200 will cause the bumpers to be misaligned, resulting in failure to block actuator contact.

The MEMS beam contains one or more layers of metal and dielectric and the layers can have differing thermal expansion coefficients. For a bridge beam without lateral springs on one or both ends, the residual stress post release or thermal expansion or contraction due to heating or cooling the beam will induce beam curvature upwards or downwards since the beam is symmetrically constrained on both ends This movement may result in minimal misalignment of the mini-bumps when the beam is actuated, i.e., when it is collapsed and in contact with the fixed wires below the beam. If a bridge beam is constrained with a lateral spring 200 on one end (FIG. 26a) or both ends, then the MEMS beam 195 can move laterally when the temperature changes due to elongation of the spring or after release due to residual stress in the beam, as discussed above, which causes misalignment of the mini-bumps with its landing structure, e.g., fixed actuator, dummy shape, etc. Thus, the lateral springs 200 used in bridge MEMS beams to allow for a lateral beam shift instead of a vertical shift when the temperature changes to reduce the temperature-induced variation in actuation gap or beam curvature can cause collapsed beam misalignment of oxide bumpers. The springs 200 can be used on both ends of the MEMs beam, as can be represented in FIG. 26a.

It should be understood by those of skill in the art that the dimensions of the springs 200 can vary, based on the materials used to form the MEMS beam. For example, different spring constants (stiffness) can be used in the design of the lateral springs 200 based on the coefficient of thermal expansion (CTE) mismatch between the materials of the MEMS beam, e.g., wiring metal and insulator material. Specifically, a higher spring constant may be required as the CTE mismatch becomes greater, in order to better control the shifting of the MEMS beam 195 and, hence, to ensure that the array of mini-bumps land on the proper structure, as discussed herein.

The springs 200 can be manufactured using conventional CMOS processes during the fabrication of the MEMS beam. For example, the springs 200 can extend from one or both ends of a bridge MEMS beam or a single end from a cantilever MEMS beam. In addition, the springs 200 can be fabricated from the same material used for the wiring of the MEMS beam, e.g., metal material. The material can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, the springs 200 could be formed from pure refractory metals, or aluminum or an aluminum alloy such as AlCu, AlSi, or AlCuSi. In embodiments the springs 200 could be cladded with Ti and capped with an antireflective layer TiN, e.g. Ti/Al/Ti/TiN.

Also, the dimensions of the spring 200 (thickness) can be the same or similar to that of the wiring layer of the MEMS beam, or different depending on the desired stiffness of the spring. Also, in embodiments, the springs 200 can be fabricated to attach to the upper and/or lower wiring (metal) layer of the MEMS beam, depending on the design parameters and calculated lateral shift of the MEMS beam. The spring 200 can also be fabricated in different shapes such as, for example, straight, zigzag, "S" shape, etc. depending on the required stiffness, etc.

One problem with using an asymmetric lateral spring is that the residual stress in the beam will induce a horizontal contraction or expansion of the beam. In this embodiment, the lateral movement of an asymmetric bridge beam, either due to temperature variation or to the room temperature residual stress in the MEMS beam, can be taken into account when designing the mini-bumps that land either on a dummy actuator shape or in a space between the actuators. FIG. 26b shows the actuator wires $14a_1$ and dummy wires $14a_2$.

Note that the lateral movement of the beam will not be constant. For example, a released asymmetric bridge beam can exhibit a 1 micron lateral movement in the lateral spring 200 and this lateral movement will approximately linearly decrease towards the fixed end of the beam, i.e., for a 400 micron long beam there would be a 1 micron lateral shift at the lateral spring, a 0.5 micron lateral shift 200 microns away from the lateral spring, and so forth.

FIGS. 27a and 27b show examples of lateral shift of a MEMS beam in accordance with aspects of the present invention. More specifically, FIG. 27a shows the case where the released asymmetric MEMS beam has no residual stress at room temperature and does not move laterally. For this case, the mini-bumps 105 are placed in the center or nearly in the center of the opposite actuator opening 197. More specifically, FIG. 27a shows the mini-bumps (array of mini-bumps) 105 landing on a dummy actuator $14a_2$. In this embodiments, the array of mini-bumps 105 can be provided within a hole of the MEMS beam 195. The array of mini-bumps 105 are centered above an opening of the fixed actuator or lower wiring 197. FIG. 27a can also represent the mini-bumps (array of mini-bumps) 105 landing within an opening (space) of the fixed actuator or on the fixed actuator, depending on the particular embodiment used with the present invention as shown, for example, in FIGS. 18a-22b. The fixed actuator, dummy actuator or opening of the fixed actuator are all generally shown at reference numeral 14a$_2$.

FIG. 27b shows the case where there is a systematic 1 micron lateral movement of the MEMS beam post release at the location of the mini-bump shown, due to residual stress in the MEMS beam 195. In this case, the array of mini-bumps 105 is moved laterally towards the fixed end of the MEMS beam 195, but still lands on the dummy actuator or opening of the fixed actuator, etc. 14a$_2$. This is due to the dimensional compensation provided by the present invention, taking into consideration the calculated shift of the MEMS beam due to a non-zero post-release residual stress of materials which comprise the MEMS beam. As should be understood, the lateral movement of the mini-bump placement decreases the further the mini-bump is located away from the lateral spring 200.

Table 1 shows compensation of dimensional features of MEMS components based on thermal coefficient mismatch of materials which comprise the MEMS beam, in accordance with aspects of the present invention. It should be understood by those of skill in the art that Table 1 is only illustrative examples of such dimensional features, and should not be considered a limiting feature. More specifically, cells 1a and 1b are examples of embodiments discussed previously, which are for a symmetric MEMS bridge beam with no thermal expansion or stress-driven lateral movement. In these scenarios, there is no need to make any additional compensations for landing (or holes) of the array of mini-bumps. Cells 2a and 2b, on the other hand, are for asymmetric MEMS bridge beams with a lateral spring or other asymmetry on one end of the beam, in which case the landing (or holes) for the array of mini-bumps is increased due to the possibility of lateral shift. The configurations of the landing and holes for the fixed actuator and the beam actuator should be understood especially in view of the many different variations and configurations shown in FIGS. 18a-22b. As discussed above, the lateral movement of a MEMS beam with a lateral spring 200 may not be constant since either the beam will be fixed on one end or the beam but flexible on the end with the lateral spring; or will be under compression or tension away from the lateral springs 200 on both ends in the middle of the beam.

TABLE 1

| Cells | Fixed Actuator Hole (in microns) | Fixed Actuator Landing (in microns) | Beam Actuator Hole (in microns) |
|---|---|---|---|
| 1a | 1.5 (width) × 1.5 (long) | None | 1.1 (width) × 1.1 (long) |
| 1b | 1.5 × 1.5 | 0.5 (width) × 0.5 (long) | 1.1 × 1.1 |
| 2a | 2.1 × 2.9 | None | 2.9 × 4.7 |
| 2b | 2.1 × 2.9 | 1.1 × 1.9 | 2.9 × 4.7 |

As thus shown in Table 1, the cells 2a and 2b have larger hole dimensions for both the fixed actuator hole and the beam actuator hole due to the possibility of lateral shift of the MEMS beam. The dimensions of the fixed actuator landing is also increased due to the possibility of the lateral shift of the MEMS beam. These increased dimensions will assure that the array of mini-bumps will land in the proper place on the designed structure, preventing beam over collapse. It should be understood by those of skill in the art that the dimensions of the fixed actuator hole and the beam actuator hole are fabricated in accordance with aspects of the present invention using, for example, CMOS processes.

Figure 28:
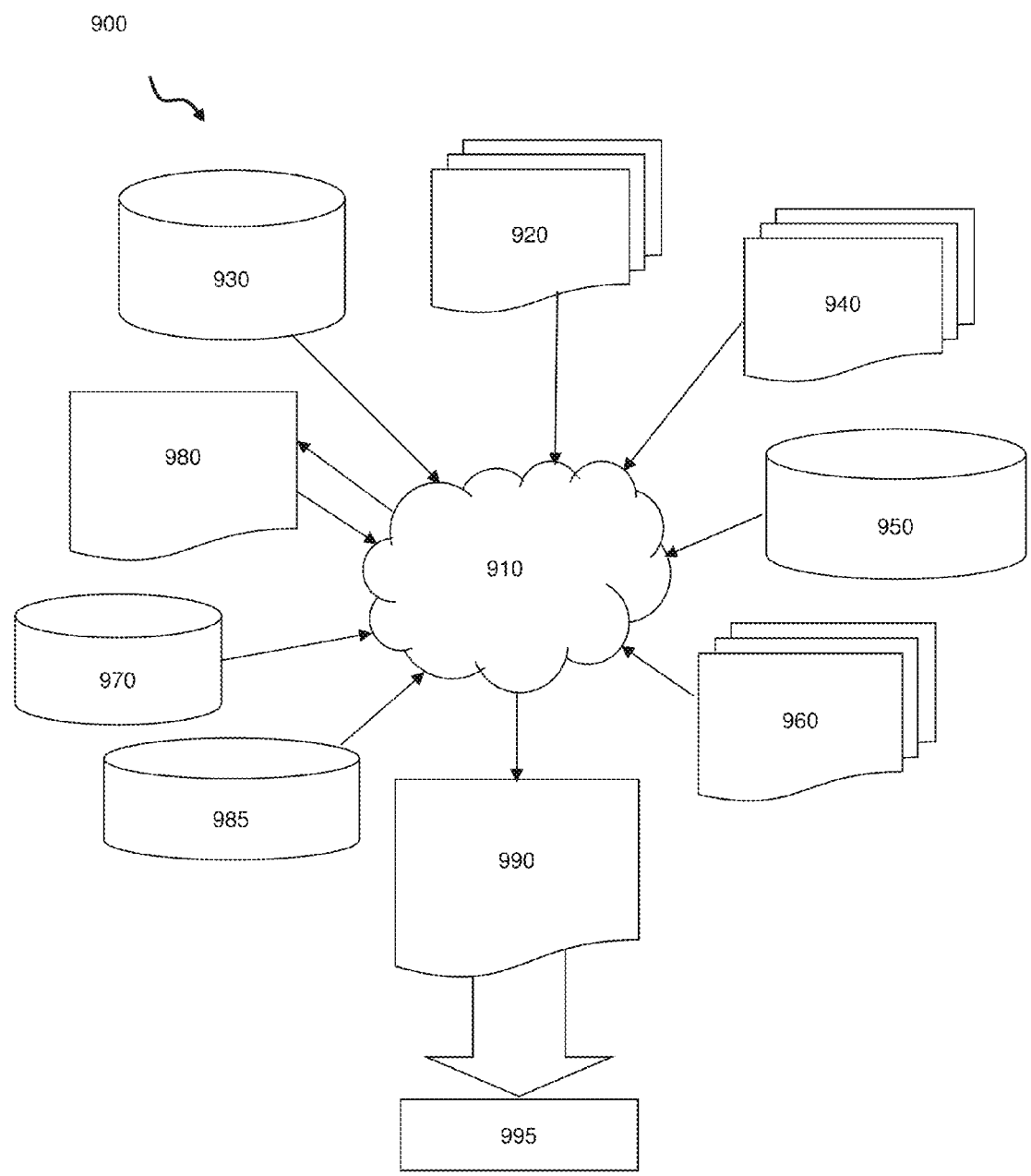
FIG. 28 is a flow diagram of a design process used in semiconductor design, manufacture, and/or test.

FIG. 28 is a flow diagram of a design process used in semiconductor design, manufacture, and/or test. FIG. 28 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-27b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 28 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-27b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-27b to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-27b. In one embodiment, design structure 990 may comprise a compiled, executable HDL simulation model that functionally simulates the devices shown in FIGS. 1-27b.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-27b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of forming a Micro-Electro-Mechanical (MEMS) structure, comprising:
   forming a MEMS beam;
   forming a plurality of electrodes;
   forming an array of mini-bumps between the MEMS beam and the plurality of electrodes; and
   determining a size of a space between fixed actuator electrodes of the plurality of electrodes or a dummy actuator based on a lateral shift of the MEMS beam,
   forming at least one spring extending both ends of the MEMS beam, wherein the at least one spring has a predetermined spring constant based on a coefficient of thermal expansion (CTE) mismatch between materials of the MEMS structure and the at least one spring.

2. The method of claim 1, wherein the determining provides a landing location of the array of mini-bumps when there is the lateral shift of the MEMS beam.

3. The method of claim 1, wherein determining comprises a location in which the array of the mini-bumps centered or nearly centered within the space between the fixed actuator electrodes.

4. The method of claim 1, further comprising forming a spring extending from at least one end of the MEMS beam.

5. The method of claim 1, wherein the MEMS beam comprises one or more layers of metal and dielectric and the layers have differing thermal expansion coefficients which, over a temperature range, induces beam curvature upwards or downwards, and the at least one spring provides for lateral beam shift when temperature changes, thereby reducing temperature-induced variation in actuation gap or beam curvature.

* * * * *